(12) United States Patent
Jung et al.

(10) Patent No.: US 12,127,408 B2
(45) Date of Patent: Oct. 22, 2024

(54) NONVOLATILE MEMORY DEVICE AND METHOD FOR FABRICATING THE SAME

(71) Applicant: SAMSUNG ELECTRONICS CO., LTD., Suwon-si (KR)

(72) Inventors: Young-Jin Jung, Hwaseong-si (KR); Bong Tae Park, Seoul (KR); Ho Jun Seong, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/312,782

(22) Filed: May 5, 2023

(65) Prior Publication Data

US 2023/0276628 A1    Aug. 31, 2023

Related U.S. Application Data

(63) Continuation of application No. 17/360,013, filed on Jun. 28, 2021, now Pat. No. 11,683,934, which is a continuation of application No. 16/818,294, filed on Mar. 13, 2020, now Pat. No. 11,081,499.

(30) Foreign Application Priority Data

Aug. 1, 2019    (KR) ........................ 10-2019-0093632

(51) Int. Cl.
| | | |
|---|---|---|
| *H10B 43/27* | (2023.01) | |
| *H01L 23/522* | (2006.01) | |
| *H01L 23/528* | (2006.01) | |
| *H10B 43/10* | (2023.01) | |
| *H10B 43/40* | (2023.01) | |
| *H10B 43/50* | (2023.01) | |

(52) U.S. Cl.
CPC ......... *H10B 43/27* (2023.02); *H01L 23/5226* (2013.01); *H01L 23/528* (2013.01); *H10B 43/10* (2023.02); *H10B 43/40* (2023.02); *H10B 43/50* (2023.02)

(58) Field of Classification Search
CPC ........ H10B 43/27; H10B 43/50; H10B 43/40; H10B 43/10; H01L 23/5226; H01L 23/528
USPC ........................................................ 257/324
See application file for complete search history.

(56) References Cited

U.S. PATENT DOCUMENTS

| | | |
|---|---|---|
| 8,138,489 B2 | 3/2012 | Tanaka et al. |
| 8,563,961 B2 | 10/2013 | Sasago et al. |
| 8,709,894 B2 | 4/2014 | Lee et al. |

(Continued)

FOREIGN PATENT DOCUMENTS

KR        20130045622 A    5/2013

*Primary Examiner* — Tu-Tu V Ho
(74) *Attorney, Agent, or Firm* — Myers Bigel, P.A.

(57) ABSTRACT

A nonvolatile memory device with improved operation performance and reliability, and a method for fabricating the same are provided. The nonvolatile memory device includes a substrate, a peripheral circuit structure on the substrate, a mold structure including a plurality of insulating patterns and a plurality of gate electrodes stacked alternately on the peripheral circuit structure, a channel structure penetrating the mold structure, a first impurity pattern in contact with first portions of the channel structure and having a first conductivity type, on the mold structure, and a second impurity pattern in contact with second portions of the channel structure and having a second conductivity type different from the first conductivity type, on the mold structure.

18 Claims, 20 Drawing Sheets

(56) References Cited

U.S. PATENT DOCUMENTS

| | | |
|---|---|---|
| 9,177,999 B2 | 11/2015 | Sasago et al. |
| 9,230,981 B2 | 1/2016 | Oh et al. |
| 9,236,394 B2 | 1/2016 | Rhie |
| 9,543,316 B2 * | 1/2017 | Lee .................. H10B 43/10 |
| 9,601,204 B2 | 3/2017 | Park et al. |
| 9,773,806 B1 | 9/2017 | Lee et al. |
| 9,972,640 B1 | 5/2018 | Kai et al. |
| 10,002,877 B2 | 6/2018 | Park et al. |
| 10,090,324 B2 | 10/2018 | Tang et al. |
| 10,644,026 B2 | 5/2020 | Lee et al. |
| 2018/0040553 A1 | 2/2018 | Tak et al. |

\* cited by examiner

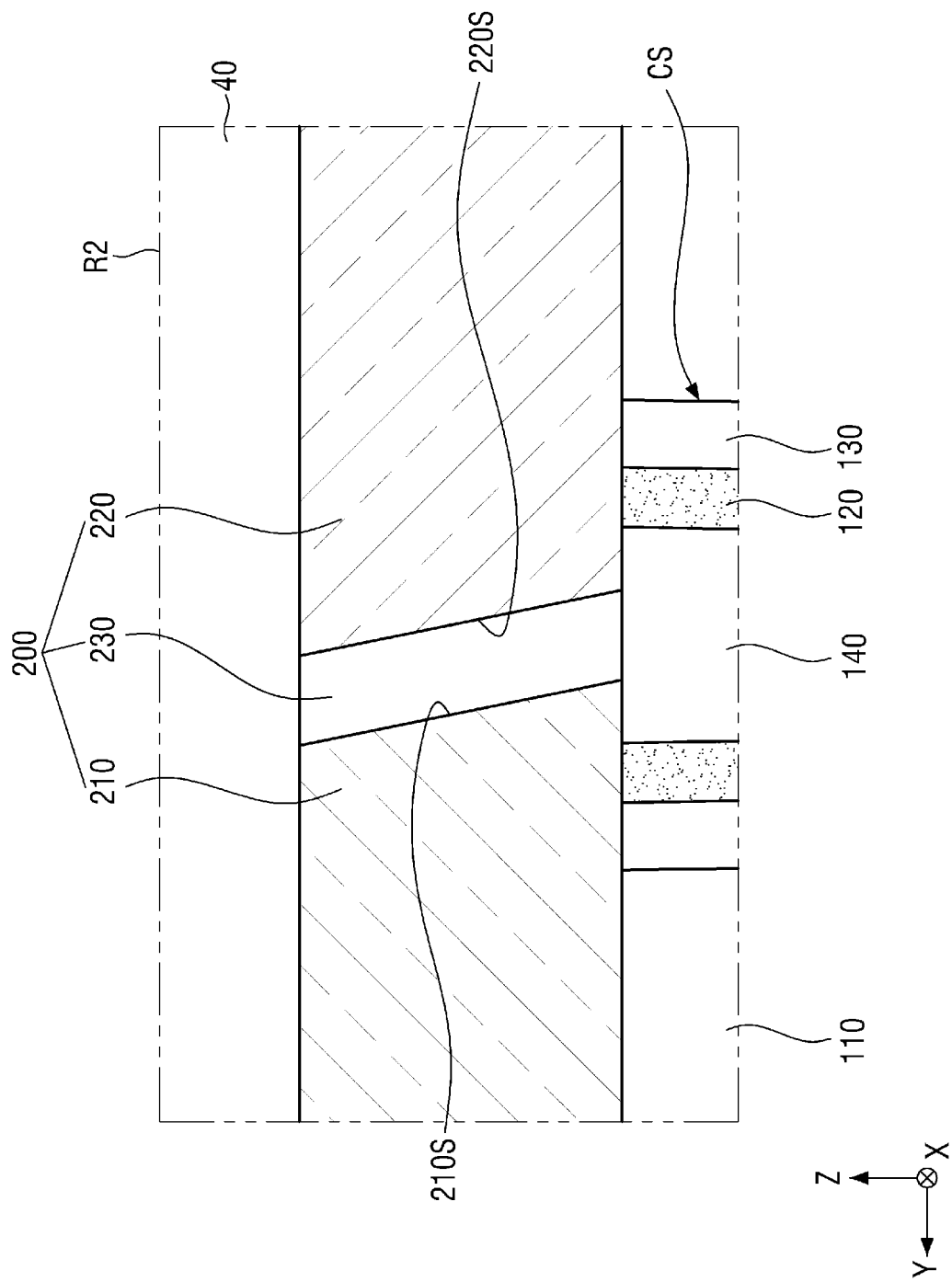

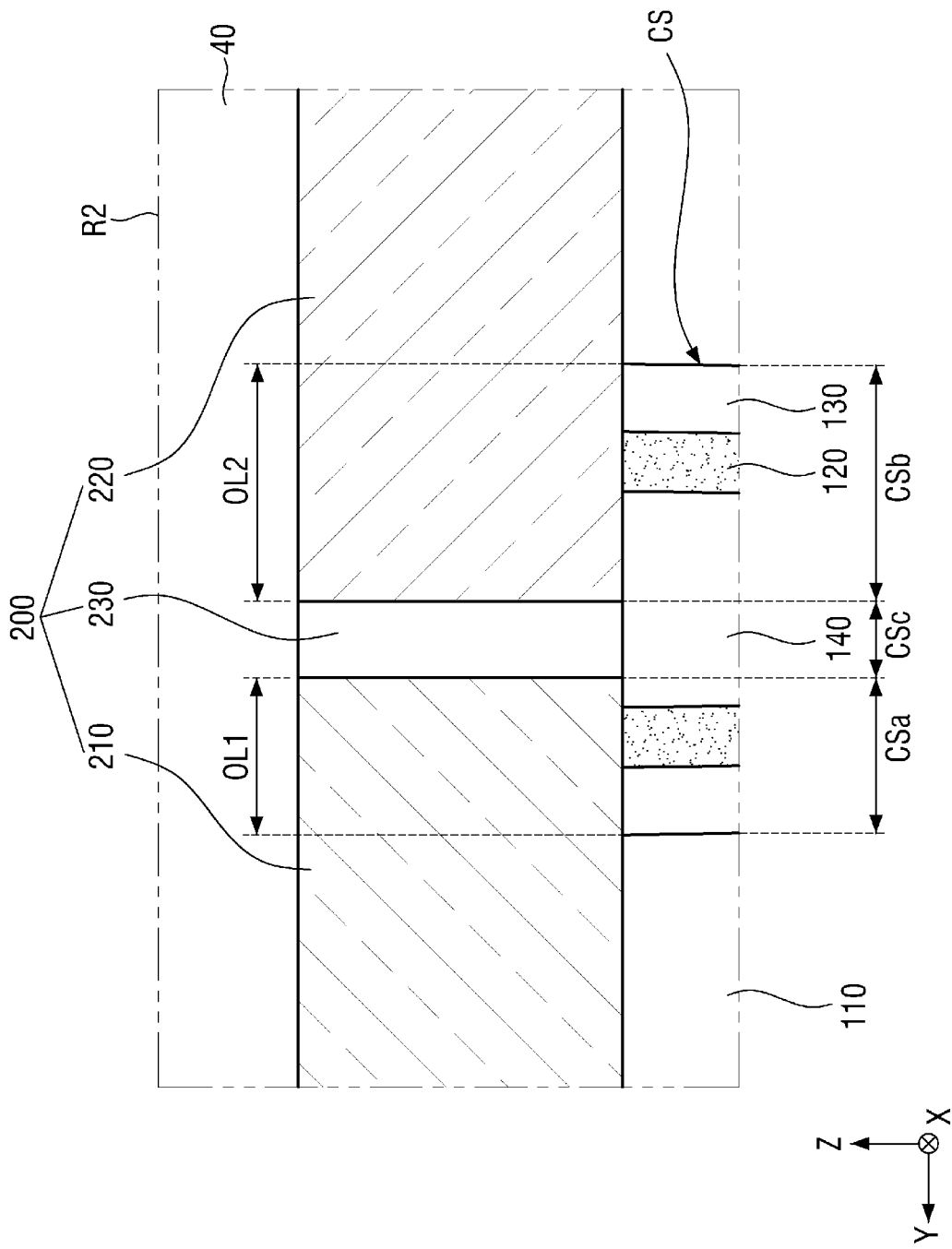

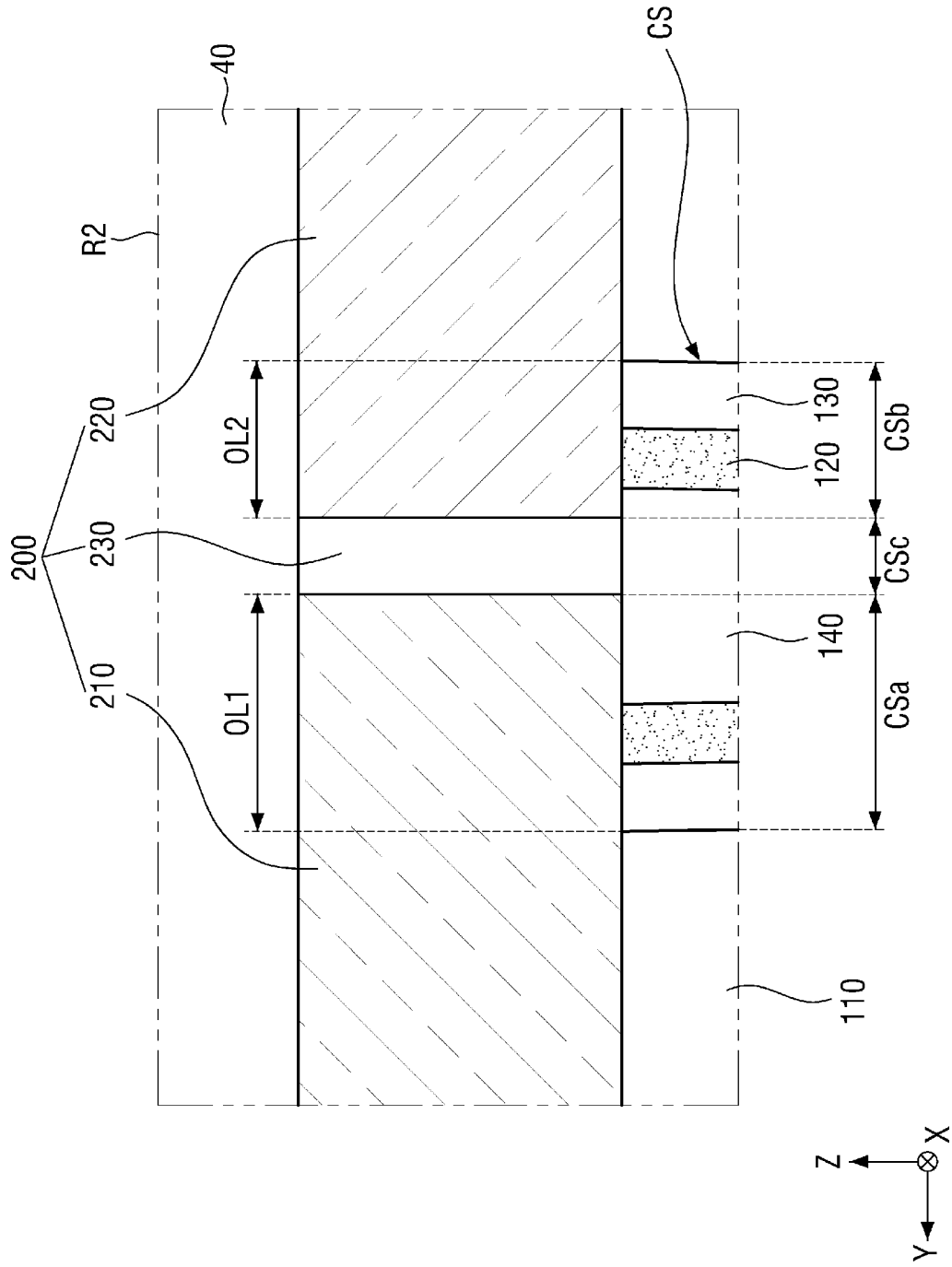

NONVOLATILE MEMORY DEVICE AND METHOD FOR FABRICATING THE SAME

CROSS-REFERENCE TO RELATED APPLICATIONS

This U.S. non-provisional patent application is a continuation of U.S. patent application Ser. No. 17/360,013, filed Jun. 28, 2021, which application is a continuation of U.S. patent application Ser. No. 16/818,294, filed Mar. 13, 2020, which issued as U.S. Pat. No. 11,081,499, on Aug. 3, 2021, which itself claims priority under 35 U.S.C. § 119 to Korean Patent Application No. 10-2019-0093632, filed on Aug. 1, 2019 in the Korean Intellectual Property Office, the contents of both of which are incorporated herein in their entireties.

BACKGROUND

The present inventive concept relates to a nonvolatile memory device and a method for fabricating the same. More specifically, the present inventive concept relates to a nonvolatile memory device having a COP (Cell Over Peri) structure and a method for fabricating the same.

In order to satisfy superior performance and low cost required by consumers, the degree of integration of nonvolatile memory devices is increasing. In the case of a two-dimensional or planar memory device, the degree of integration is determined by an area occupied by a unit memory cell. Therefore, three-dimensional memory devices in which unit memory cells are arranged vertically have been developed.

In order to further improve the degree of integration of the nonvolatile memory devices, a COP (Cell Over Peri) structure in which a cell array is on a peripheral circuit has been studied.

SUMMARY

Some embodiments of the present inventive concept provide a nonvolatile memory device with improved operation performance and reliability.

Some embodiments of the present inventive concept provide a method for fabricating a nonvolatile memory device with improved operation performance and reliability.

However, some embodiments of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to some embodiments of the present inventive concept, there is provided a nonvolatile memory device comprising a substrate, a peripheral circuit structure on the substrate, a mold structure including a plurality of insulating patterns and a plurality of gate electrodes stacked alternately on the peripheral circuit structure, a channel structure penetrating the mold structure, a first impurity pattern in contact with a first portion of the channel structure and having a first conductivity type, on the mold structure, and a second impurity pattern in contact with a second portion of the channel structure and having a second conductivity type different from the first conductivity type, on the mold structure.

According to some embodiments of the present inventive concept, there is provided a nonvolatile memory device comprising a substrate, an interlayer insulating layer on the substrate, a bit line extending in a first direction, in the interlayer insulating layer, a mold structure including a plurality of insulating patterns and a plurality of gate electrodes alternately stacked on the interlayer insulating layer, a channel structure penetrating the mold structure and connected to the bit line, and a source structure in contact with an upper part of the channel structure on the mold structure. The source structure includes a first impurity pattern which overlaps a first region of the channel structure, a second impurity pattern which overlaps a second region of the channel structure, and a separation pattern which overlaps a third region of the channel structure and separates the first impurity pattern and the second impurity pattern.

According to some embodiments of the present inventive concept, there is provided a nonvolatile memory device comprising a substrate, a peripheral circuit structure on the substrate, a bit line extending in a first direction on the peripheral circuit structure, a mold structure including a plurality of insulating patterns and a plurality of gate electrodes alternately stacked on the bit line, a plurality of channel structures penetrating the mold structure, lower parts of each of the channel structures being connected to the bit line, and a source structure connected to upper parts of each of the channel structures on the mold structure, wherein the source structure includes a first impurity pattern overlapping a first region of each of the channel structures, a second impurity pattern overlapping a second region of each of the channel structures, and a separation pattern which overlaps a third region of each of the channel structures and separates the first impurity pattern and the second impurity pattern, the first impurity pattern includes an n-type impurity, and the second impurity pattern includes a p-type impurity.

BRIEF DESCRIPTION OF THE DRAWINGS

These and/or other aspects will become apparent and more readily appreciated from the following description of the embodiments, taken in conjunction with the accompanying drawings in which:

FIGS. 4A to 4E are various enlarged views in which a region R2 of FIG. 2 is enlarged.

DETAILED DESCRIPTION

In the COP structure, by locating the peripheral circuit, which has been arranged around the cell array, between the cell array and the substrate, more cell arrays may be integrated in the same area. Hereinafter, a nonvolatile memory device according to some embodiments will be described with reference to FIGS. 1 to 10.

Figure 1:
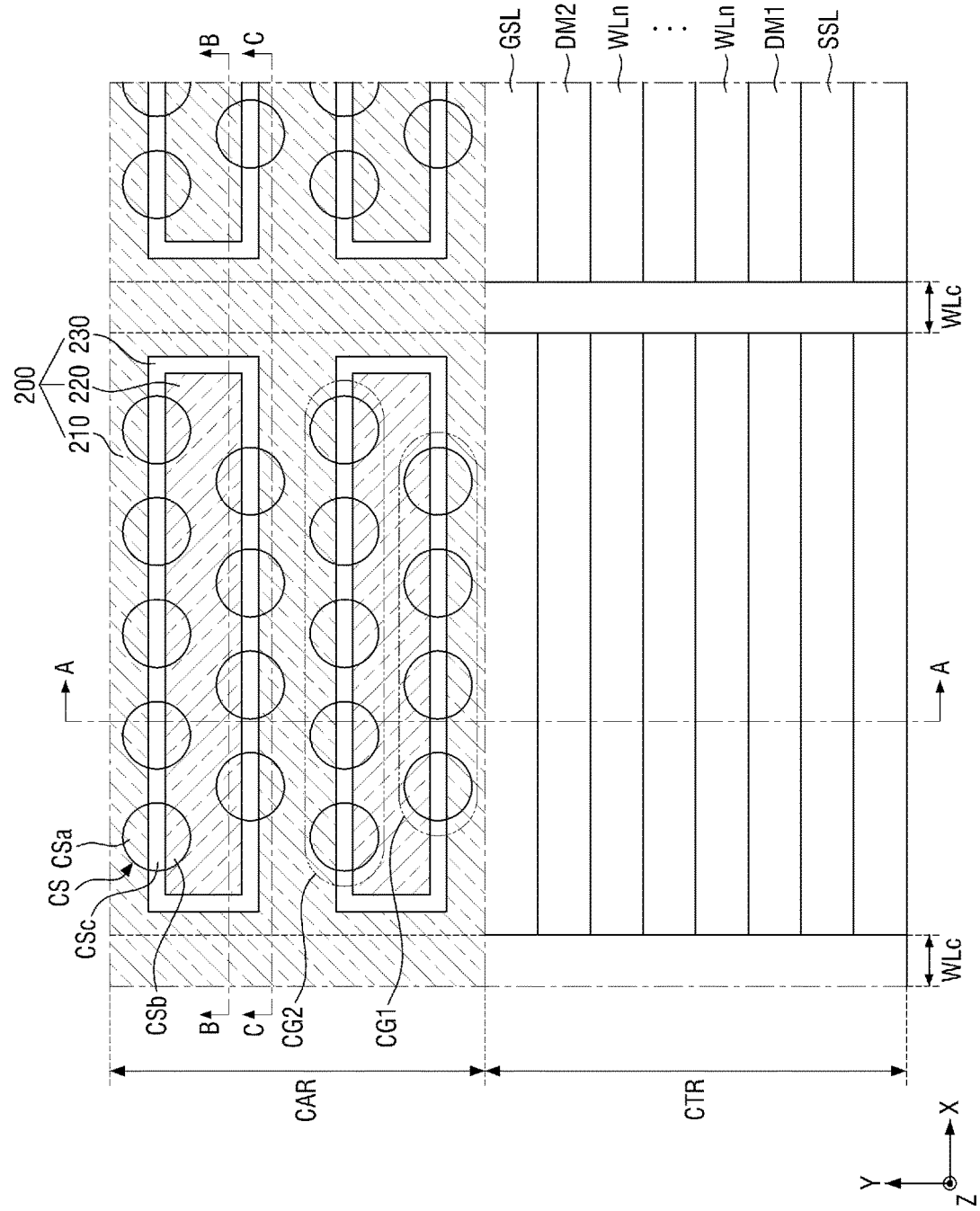
FIG. 1 is a layout diagram for explaining the nonvolatile memory device according to some embodiments.
Figure 2:
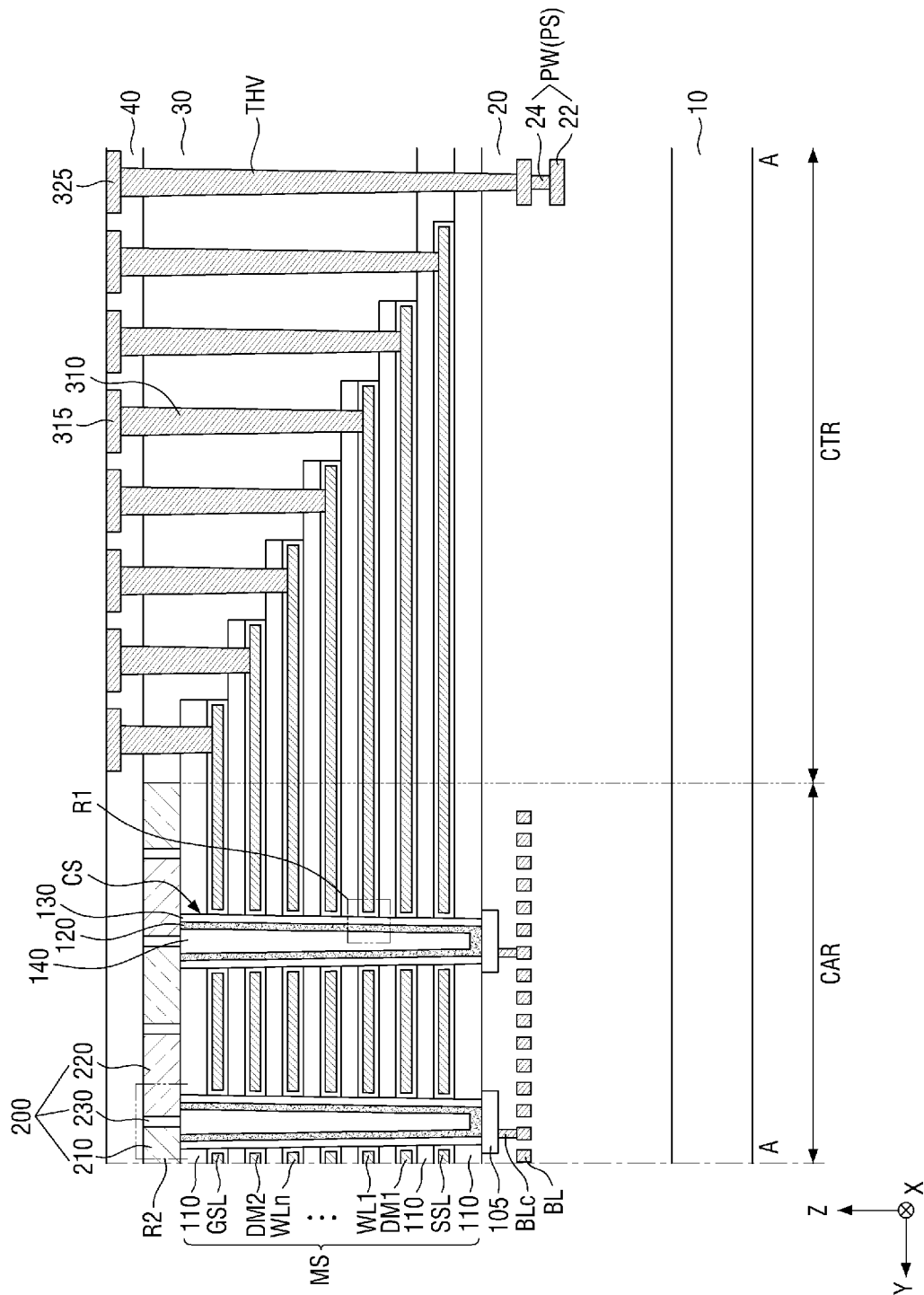
FIG. 2 is a cross-sectional view taken along a line A-A of FIG. 1.
Figure 3:
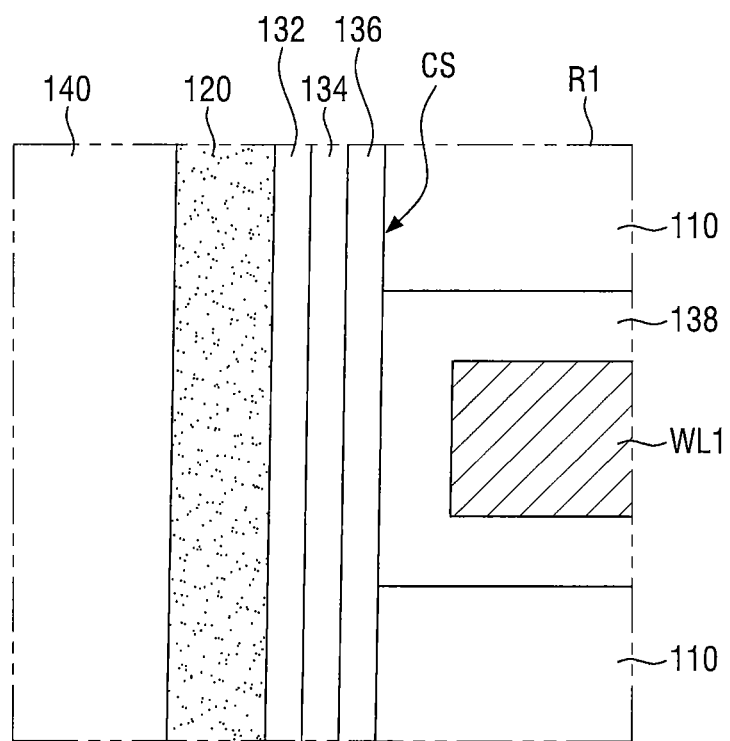
FIG. 3 is an enlarged view of a region R1 of FIG. 2.
Figure 5:
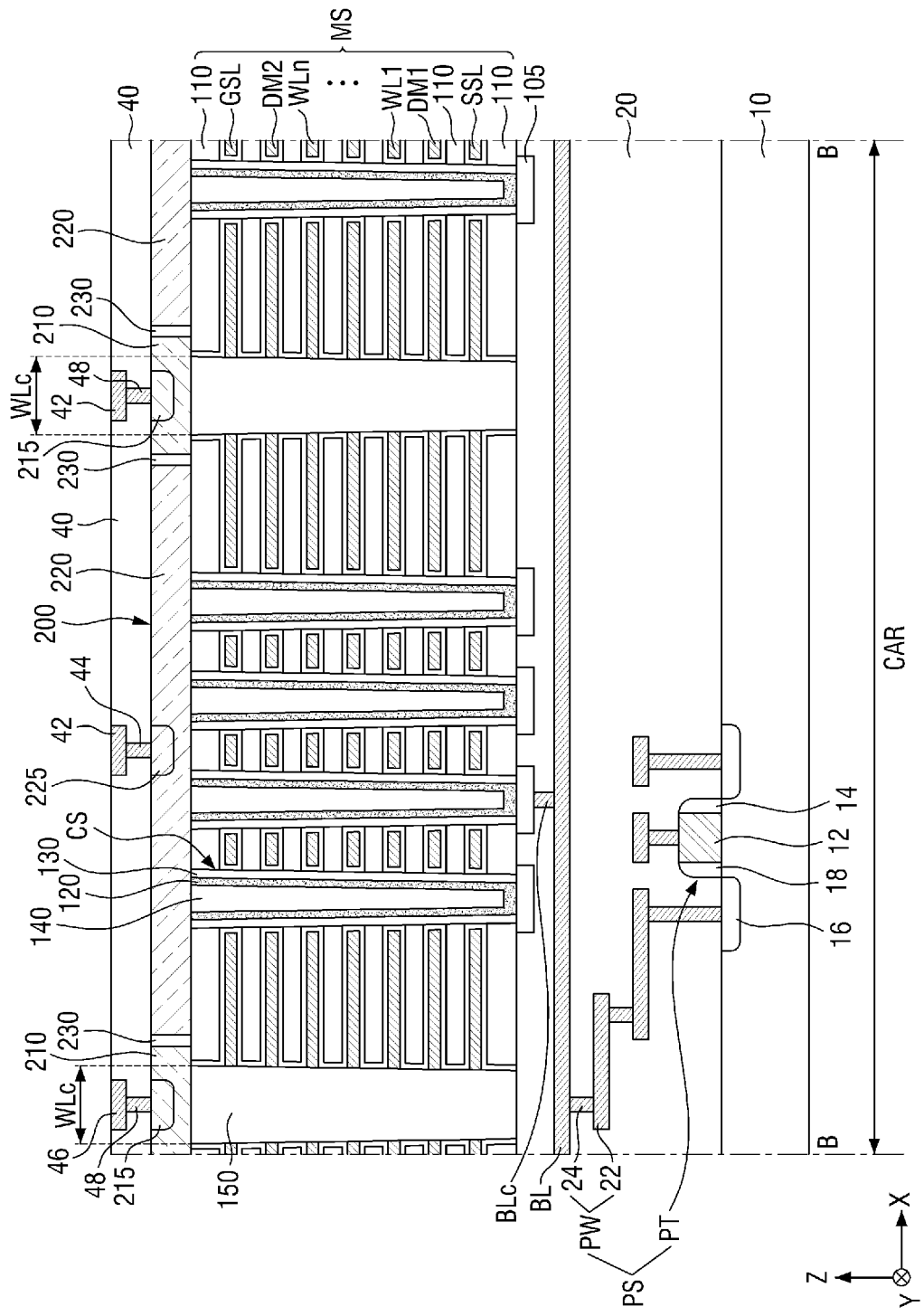
FIG. 5 is a cross-sectional view taken along a line B-B of FIG. 1.
Figure 6:
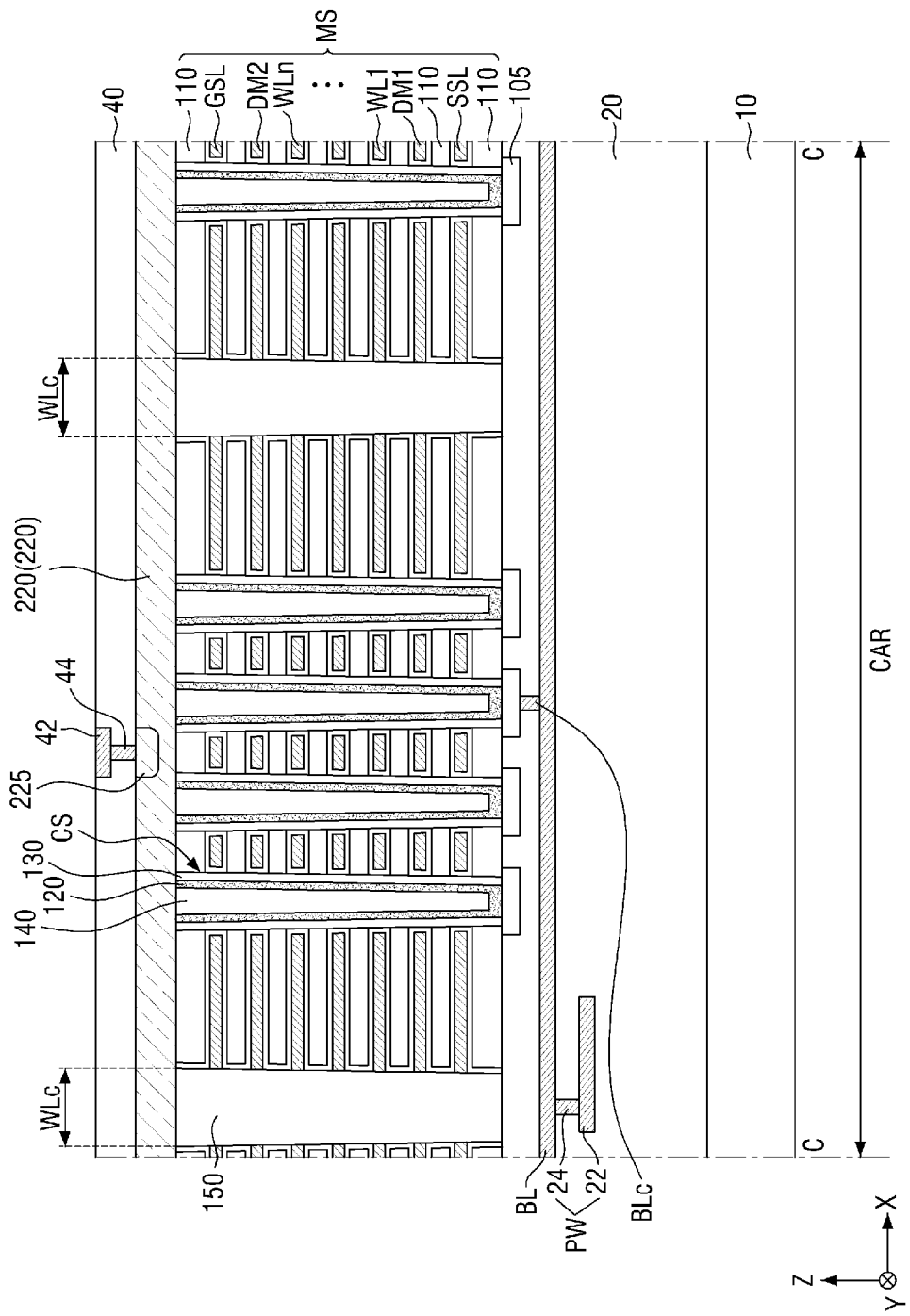
FIG. 6 is a cross-sectional view taken along a line C-C of FIG. 1.

FIG. 1 is a layout diagram for explaining the nonvolatile memory device according to some embodiments. FIG. 2 is a cross-sectional view taken along a line A-A of FIG. 1. FIG. 3 is an enlarged view of a region R1 of FIG. 2. FIGS. 4A to 4E are various enlarged views in which a region R2 of FIG. 2 is enlarged. FIG. 5 is a cross-sectional view taken along a line B-B of FIG. 1. FIG. 6 is a cross-sectional view taken along a line C-C of FIG. 1.

Referring to FIGS. 1 to 6, the nonvolatile memory device according to some embodiments includes a substrate 10, a peripheral circuit structure PS, a mold structure MS, a plurality of channel structures CS, a plurality of bit lines BL and a source structure 200.

The substrate 10 may include, for example, a semiconductor substrate such as a silicon substrate, a germanium substrate or a silicon-germanium substrate. In some embodiments, the substrate 10 may include a silicon-on-insulator (SOI) substrate, a germanium-on-insulator (GOI) substrate, or the like. The substrate 10 may be, for example, but is not limited to, a p-type semiconductor substrate.

The substrate 10 may include a cell array region CAR and a contact region CTR.

A memory cell array including a plurality of memory cells may be formed in the cell array region CAR. The memory cell array may include a plurality of memory cells, and a plurality of word lines and bit lines electrically connected to the respective memory cells. For example, a bit line BL, a mold structure MS, a channel structure CS, and a source structure 200 to be described below may be formed in the cell array region CAR.

The contact region CTR may be disposed around the cell array region CAR. For example, memory cell contacts 310 and a through via THV may be formed in the contact region CTR.

The peripheral circuit structure PS may be formed on the substrate 10. The peripheral circuit structure PS may include a peripheral circuit that controls the operation of each memory cell. For example, the peripheral circuit structure PS may include a row decoder, a column decoder, a page buffer, a control circuit, and/or the like. For example, as illustrated in FIG. 5, the peripheral circuit structure PS may include a peripheral circuit element PT and a wiring structure PW.

In some embodiments, the peripheral circuit element PT may include a transistor. For example, the peripheral circuit element PT may include a peripheral circuit gate electrode 12, a peripheral circuit gate insulating layer 14, a source/drain region 16, and a gate spacer 18.

The peripheral circuit gate electrode 12 may be formed on the substrate 10. The peripheral circuit gate electrode 12 may include, for example, but is not limited to, at least one of silicon (e.g., polysilicon), metal silicide (e.g., tungsten silicide (WSi), nickel silicide (NiSi), cobalt silicide (CoSi), or titanium silicide (TiSi), tantalum silicide (TaSi)), or metal (e.g., tungsten (W) or aluminum (Al)). In some embodiments, the peripheral circuit gate electrode 12 may be formed of a plurality of conductive layers.

The peripheral circuit gate insulating layer 14 may be interposed between the substrate 10 and the peripheral circuit gate electrode 12. For example, the peripheral circuit gate insulating layer 14 may extend along an upper surface of the substrate 10. The peripheral circuit gate insulating layer 14 may include, for example, but is not limited to, at least one of silicon oxide, silicon nitride, silicon oxynitride, and/or a high dielectric constant material having a higher dielectric constant than that of silicon oxide.

The source/drain region 16 may be formed in the substrate 10 on both sides of the peripheral circuit gate electrode 12. The source/drain region 16 may be doped with impurities. For example, when the peripheral circuit element PT is an n-type (or a p-type) transistor, the source/drain region 16 may be doped with an n-type (or p-type) impurity.

The gate spacer 18 may be formed on both side surfaces of the peripheral circuit gate electrode 12. For example, the peripheral circuit gate electrode 12 and the peripheral circuit gate insulating layer 14 may be formed to fill or at least partially fill a trench formed by an upper surface of the substrate 10 and an inner surface of the gate spacer 18.

In some embodiments, the peripheral circuit element PT may be a high-voltage transistor. Although the peripheral circuit element PT is described only as a transistor, this is merely an example, and the technical idea of the present inventive concept is not limited thereto. For example, the peripheral circuit element PT includes not only various active elements such as transistors, but also various passive elements such as capacitors, resistors, and inductors.

In some embodiments, the peripheral circuit element PT may include a well bias driver. The well bias driver may provide an erasing voltage necessary for the erasing operation of each memory cell to the channel structure CS.

In some embodiments, a first interlayer insulating layer 20 may be formed on the substrate 10. The first interlayer insulating layer 20 may be formed to cover or overlap the peripheral circuit element PT on the substrate 10. Although the first interlayer insulating layer 20 is illustrated as a single layer, this is only for convenience of explanation, and the first interlayer insulating layer 20 may, of course, be a multi-layer in which a plurality of insulating layers is stacked. The first interlayer insulating layer 20 may include, for example, but is not limited to, silicon oxide.

The wiring structure PW may include peripheral circuit wirings 22 and peripheral circuit contacts 24. The peripheral circuit wirings 22 and the peripheral circuit contacts 24 may be formed, for example, in the first interlayer insulating layer 20. The peripheral circuit wirings 22 may be connected to the peripheral circuit element PT through the peripheral circuit contacts 24.

The peripheral circuit wirings 22 may include, for example, but is not limited to, a metal (e.g., copper (Cu) or aluminum (Al)). The peripheral circuit contacts 24 may include, for example, but is not limited to, silicon (e.g., polysilicon) or metal (e.g., tungsten (W) or copper (Cu)).

The mold structure MS may be formed on the peripheral circuit structure PS. For example, the mold structure MS may be formed on the first interlayer insulating layer 20. That is, the peripheral circuit structure PS may be interposed between the substrate 10 and the mold structure MS. The mold structure MS may include a plurality of gate electrodes SSL, DM1, WL1 to WLn, DM2 and GSL and a plurality of insulating patterns 110 stacked on the peripheral circuit structure PS. Each of the gate electrodes SSL, DM1, WL1 to WLn, DM2 and GSL and each insulating pattern 110 may be layered structures extending in a first direction X and a second direction Y intersecting the first direction X.

The respective gate electrodes SSL, DM1, WL1 to WLn, DM2 and GSL may be stacked alternately with the respective insulating patterns 110. For example, the gate electrodes SSL, DM1, WL1 to WLn, DM2 and GSL are spaced apart from each other along a third direction Z intersecting the upper surface of the substrate 10, and may be sequentially stacked. At this time, the insulating patterns 110 may be interposed between the gate electrodes SSL, DM1, WL1 to WLn, DM2 and GSL. That is, the gate electrodes SSL, DM1, WL1 to WLn, DM2 and GSL may be electrically spaced apart from each other by the insulating pattern 110.

In FIGS. 2, 5 and 6, although the gate electrodes SSL, DM1, WL1 to WLn, DM2 and GSL are illustrated to have the same thickness, this is an example. For example, the gate electrodes SSL, DM1, WL1 to WLn, DM2 and GSL may have thicknesses different from each other.

In some embodiments, the gate electrodes SSL, DM1, WL1 to WLn, DM2 and GSL may include a string selection line SSL, a plurality of word lines WL1 to WLn, and a ground selection line GSL. The string selection line SSL, the plurality of word lines WL1 to WLn, and the ground selection line GSL may be sequentially stacked on the substrate 10.

The string selection line SSL may function as a gate electrode of a string selection transistor that controls the electrical connection between the bit line BL and each channel structure CS. The plurality of word lines WL1 to WLn may function as gate electrodes of memory cell transistors that control the respective memory cells. That is, the plurality of word lines WL1 to WLn may include a plurality of memory cells, together with the channel structure CS. The ground selection line GSL may function as a gate electrode of a ground selection transistor that controls electrical connection between the source structure 200 and each channel structure CS.

Although three word lines are illustrated between the string selection line SSL and the ground selection line GSL, this is only for convenience of explanation. For example, eight, sixteen, thirty-two, sixty-four or more word lines may, of course, be stacked between the string selection line SSL and the ground selection line GSL.

In addition, although the mold structure MS is simply illustrated to have one string selection line SSL and one ground selection line GSL, this is for convenience of explanation. For example, the mold structure MS may, of course, have two or more string selection lines SSL or two or more ground selection lines GSL.

In some embodiments, the mold structure MS may further include a first dummy line DM1 and/or a second dummy line DM2. For example, the first dummy line DM1 may be interposed between the string selection line SSL and the plurality of word lines WL1 to WLn. For example, the second dummy line DM2 may be interposed between the ground selection line GSL and the plurality of word lines WL1 to WLn. In the nonvolatile memory device according to some embodiments, the first dummy line DM1 and the second dummy line DM2 may not function as the string selection line, the word line or the ground selection line.

Each of the gate electrodes SSL, DM1, WL1 to WLn, DM2 and GSL may include a conductive material. For example, each of the gate electrodes SSL, DM1, WL1 to WLn, DM2 and GSL may include, but is not limited to, metals such as tungsten (W), cobalt (Co) and nickel (Ni) or semiconductor materials such as silicon.

Each insulating pattern 110 may include an insulating material. For example, each insulating pattern 110 may include, but is not limited to, silicon oxide.

In some embodiments, a second interlayer insulating layer 30 may be formed on the first interlayer insulating layer 20. The second interlayer insulating layer 30 may be formed to cover or overlap at least a part of the mold structure MS. Although the second interlayer insulating layer 30 is illustrated as a single layer, this is only for convenience of explanation, and the second interlayer insulating layer 30 may, of course, be a multi-layer in which a plurality of insulating layers is stacked. The second interlayer insulating layer 30 may include, for example, but is not limited to, silicon oxide.

In some embodiments, as illustrated in FIG. 2, memory cell contacts 310 and first upper wirings 315 connected to the respective gate electrodes SSL, DM1, WL1 to WLn, DM2 and GSL may be formed. The memory cell contacts 310 may be formed on the end portions of each of the gate electrodes SSL, DM1, WL1 to WLn, DM2 and GSL. For example, the memory cell contacts 310 may be formed on the contact region CTR.

The memory cell contacts 310 may be formed to be connected to the respective gate electrodes SSL, DM1, WL1 to WLn, DM2 and GSL. For example, the memory cell contacts 310 may penetrate the second interlayer insulating layer 30 and be connected to the respective gate electrodes SSL, DM1, WL1 to WLn, DM2 and GSL.

The first upper wiring 315 may be formed on the memory cell contact 310. For example, the first upper wiring 315 may be formed in a third interlayer insulating layer 40 on the second interlayer insulating layer 30. Accordingly, the first upper wiring 315 may be electrically connected to the respective gate electrodes SSL, DM1, WL1 to WLn, DM2 and GSL to apply a gate voltage to the respective gate electrodes SSL, DM1, WL1 to WLn, DM2 and GSL.

In some embodiments, a through via THV connected to the peripheral circuit structure PS and a second upper wiring 325 may be formed. For example, the through via THV may penetrate the second interlayer insulating layer 30 and be connected to the wiring structure PW. The second upper wiring 325 may be formed on the through via THV. For example, the second upper wiring 325 may be formed in the third interlayer insulating layer 40.

The first upper wiring 315 and the second upper wiring 325 may include, for example, but are not limited to, metal (e.g., copper (Cu) or aluminum (Al)). The memory cell contact 310 and the through vias THV may include, but are not limited to, for example, silicon (e.g., polysilicon) or metal (e.g., tungsten (W) or copper (Cu)).

In some embodiments, the mold structure MS may be cut by a word line cutting region WLc. For example, as illustrated in FIGS. 1, 5 and 6, the word line cutting region WLc may extend in the second direction Y and cut the mold structure MS.

In some embodiments, the insulating structure 150 may be formed in the word line cutting region WLc. The insulating structure 150 may be formed to fill the word line cutting region WLc. As illustrated in FIGS. 5 and 6, the insulating structure 150 may penetrate the mold structure MS and extend to the first interlayer insulating layer 20. Therefore, the insulating structure 150 extends in the second direction Y, and may cut the mold structure MS.

The insulating structure 150 may include, for example, but is not limited to, at least one of silicon oxide, silicon nitride, silicon oxynitride, and/or a high dielectric constant material having a higher dielectric constant than that of silicon oxide.

The plurality of channel structures CS may penetrate the mold structure MS. Also, the plurality of channel structures CS may extend in a direction intersecting the plurality of gate electrodes SSL, DM1, WL1 to WLn, DM2 and GSL. For example, each channel structure CS may have a pillar shape (e.g., a cylindrical shape) extending in the third direction Z. Each channel structure CS may include a semiconductor pattern 120 and an information storage layer 130.

The semiconductor pattern 120 may penetrate the mold structure MS. For example, the semiconductor pattern 120 may extend in the third direction Z. Although the semiconductor pattern 120 is illustrated as a cup shape, this is merely an example. For example, the semiconductor pattern 120 may have various shapes such as a cylindrical shape, a square barrel shape, and a solid pillar shape.

The semiconductor pattern 120 may include, for example, but is not limited to, semiconductor materials such as single crystal silicon, polycrystalline silicon, organic semiconductor material, and carbon nanostructures.

The information storage layer 130 may be interposed between the semiconductor pattern 120 and each of the gate electrodes SSL, DM1, WL1 to WLn, DM2 and GSL. For example, the information storage layer 130 may extend along the side surface of the semiconductor pattern 120.

The information storage layer 130 may include, for example, at least one of silicon oxide, silicon nitride, silicon oxynitride, and a high dielectric constant material having a higher dielectric constant than that of silicon oxide. The high dielectric constant material may include at least one of aluminum oxide, hafnium oxide, lanthanum oxide, tantalum oxide, titanium oxide, lanthanum hafnium oxide, lanthanum aluminum oxide, dysprosium scandium oxide, and/or combinations thereof.

In some embodiments, the information storage layer 130 may include a plurality of layers. For example, as illustrated in FIG. 3, the information storage layer 130 may include a tunnel insulating layer 132, a charge storage layer 134, and a first blocking insulating layer 136 sequentially stacked on the semiconductor pattern 120.

The tunnel insulating layer 132 may include, for example, silicon oxide or a high dielectric constant material having a higher dielectric constant than that of silicon oxide (e.g., aluminum oxide ($Al_2O_3$), and hafnium oxide ($HfO_2$)). The charge storage layer 134 may include, for example, silicon nitride. The first blocking insulating layer 136 may include, for example, silicon oxide or a high dielectric constant material having a dielectric constant higher than that of silicon oxide (e.g., aluminum oxide ($Al_2O_3$), and hafnium oxide ($HfO_2$)).

In some embodiments, each channel structure CS may further include a second blocking insulating layer 138. The second blocking insulating layer 138 may be interposed between the information storage layer 130 and the respective gate electrodes SSL, DM1, WL1 to WLn, DM2, and GSL. For example, the second blocking insulating layer 138 may extend along the side surfaces of each of the gate electrode SSL, DM1, WL1 to WLn, DM2 and GSL.

In some embodiments, the second blocking insulating layer 138 may extend along the upper and lower surfaces of each of the gate electrodes SSL, DM1, WL1 to WLn, DM2 and GSL. Accordingly, the second blocking insulating layer 138 may be interposed between each of the gate electrodes SSL, DM1, WL1 to WLn, DM2 and GSL and each insulating pattern 110.

In some embodiments, each channel structure CS may further include a filled insulating pattern 140. The filled insulating pattern 140 may be formed to fill the inside of the semiconductor pattern 120 having a cup shape. For example, the semiconductor pattern 120 may extend along the side surface and the bottom surface of the filled insulating pattern 140. The filled insulating pattern 140 may include, for example, but is not limited to, silicon oxide.

In some embodiments, the plurality of channel structures CS may be repeatedly arranged along the first direction X and the second direction Y. For example, as illustrated in FIG. 1, some parts of the plurality of channel structures CS may be arranged along the first direction X and form a first channel group CG1. Further, some other parts of the plurality of channel structures CS may be arranged along the first direction X and form a second channel group CG2. The first channel group CG1 and the second channel group CG2 may be arranged side by side to be adjacent to each other. For example, the second channel group CG2 may be adjacent to the first channel group CG1 in the second direction Y.

In some embodiments, the plurality of channel structures CS may be arranged in a zigzag form. For example, as illustrated in FIG. 1, the channel structures CS constituting the first channel group CG1 and the channel structures CS constituting the second channel group CG2 may be arranged to cross each other in the second direction Y. The plurality of channel structures CS arranged in the zigzag form may further improve the degree of integration of the nonvolatile memory device according to some embodiments.

In FIG. 1, although the number of channel structures CS constituting or making up the first channel group CG1 (e.g., four) is illustrated to be smaller than the number of channel structures CS constituting or making up the second channel group CG2 (e.g., five), this is only an example. For example, even if a plurality of channel structures CS is arranged in the zigzag form, the number of channel structures CS constituting or making up the first channel group CG1 may be the same as the number of channel structures CS constituting or making up the second channel group CG2.

The plurality of bit lines BL may be arranged two-dimensionally. For example, the respective bit lines BL may be spaced apart from each other and extend side by side in the first direction X. Since the word line cutting region WLc may extend in the second direction Y, each bit line BL may intersect the word line cutting region WLc.

The channel structure CS may be connected to each bit line BL. For example, each bit line BL may be connected to each channel structure CS through the bit line contact BLc.

In some embodiments, the bit line BL may be formed under the mold structure MS. That is, the bit line BL may be interposed between the substrate 10 and the mold structure MS. For example, the bit line BL and the bit line contact BLc may be formed in the first interlayer insulating layer 20. The bit line contact BLc may be interposed between the channel structure CS and the bit line BL and connect the semiconductor pattern 120 and the bit line BL. Accordingly, each bit line BL may be connected to the lower part of the semiconductor pattern 120.

In some embodiments, a stud 105 may be formed between the channel structure CS and the bit line BL. For example, the stud 105 may be formed in the first interlayer insulating layer 20. The stud 105 may connect the channel structure CS and the bit line BL. For example, the upper surface of the stud 105 may be in contact with the lower surface of the semiconductor pattern 120, and the lower surface of the stud 105 may be in contact with the upper surface of the bit line contact BLc. The stud 105 may include, for example, but is not limited to, polysilicon.

In some embodiments, the width of the stud 105 may be greater than the width of the channel structure CS and the width of the bit line contact BLc. Therefore, the stud 105 may stably connect the semiconductor pattern 120 and the bit line contact BLc.

The source structure 200 may be formed on the mold structure MS. Also, the source structure 200 is formed on the cell array region CAR and may be connected to the upper part of each channel structure CS.

The source structure 200 may include a first impurity pattern 210 and a second impurity pattern 220. The first impurity pattern 210 may be connected to some parts of each channel structure CS, and the second impurity pattern 220 may be connected to some other parts of each channel structure CS. In some embodiments, the first impurity pattern 210 and the second impurity pattern 220 may be in contact with the upper surface of the semiconductor pattern 120.

In some embodiments, the first impurity pattern 210 may have a first conductivity type, and the second impurity pattern 220 may have a second conductivity type different from the first conductivity type. Hereinafter, for convenience of explanation, it is assumed that the first impurity pattern 210 includes an n-type impurity and the second impurity pattern 220 includes a p-type impurity. However, this is only an example, and the technical idea of the present inventive concept is not limited thereto. For example, it is a matter of course that the first impurity pattern 210 may include the p-type impurity, and the second impurity pattern 220 may include the n-type impurity.

In some embodiments, the upper surface of the first impurity pattern 210 may be disposed on the same plane of the upper surface of the second impurity pattern 220. In this specification, the term "same" means not only the completely same thing but also a minute difference that may occur due to a process margin or the like. In other words, the term "same" may include elements that are substantially the same or similar.

In some examples, the source structure 200 may further include a separation pattern 230. The separation pattern 230 may be interposed between the first impurity pattern 210 and the second impurity pattern 220 to separate the first impurity pattern 210 and the second impurity pattern 220.

The separation pattern 230 may include an insulating material. The separation pattern 230 may include, for example, but is not limited to, at least one of silicon oxide, silicon nitride, and/or silicon oxynitride.

In some embodiments, the upper surface of the first impurity pattern 210 and the upper surface of the second impurity pattern 220 may be disposed on the same plane of the upper surface of the separation pattern 230.

In some embodiments, the first impurity pattern 210 may overlap some parts of each channel structure CS, and the second impurity pattern 220 may overlap some other parts of each channel structure CS. Here, the term "overlap" means an overlap in the third direction Z intersecting the upper surface of the substrate 10.

Figure 4A:
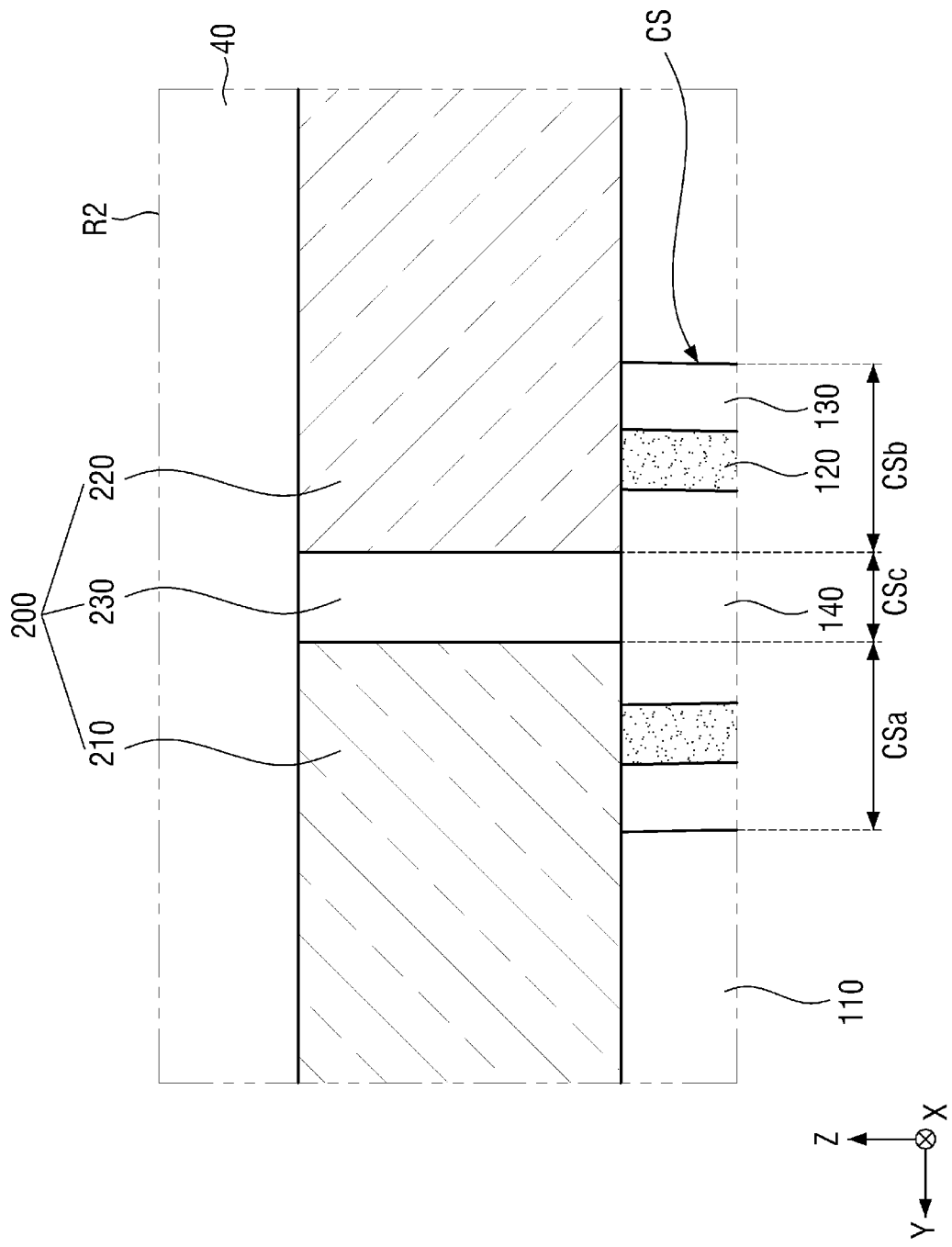

For example, as illustrated in FIGS. 1 and 4A, each channel structure CS may include a first region CSa, a second region CSb, and a third region CSc distinguished from each other from a planar viewpoint. The third region CSc may be interposed between the first region CSa and the second region CSb. At this time, the first impurity pattern 210 may overlap the first region CSa of each channel structure CS, and the second impurity pattern 220 may overlap the second region CSb of each channel structure CS. The separation pattern 230 may overlap the third region CSc of each channel structure CS.

In some embodiments, the first impurity pattern 210 having a first conductivity type (e.g., n-type) may function as a common source line CSL. For example, a ground voltage may be applied to the first impurity pattern 210 at the time of a read operation or a write operation of the nonvolatile memory device according to some embodiments.

In some embodiments, the second impurity pattern 220 having a second conductivity type (e.g., p-type) may be used for an erasing operation of the nonvolatile memory device according to some embodiments. For example, an erasing voltage may be applied to the second impurity pattern 220 at the time of the erasing operation of the nonvolatile memory device according to some embodiments.

In the nonvolatile memory device according to some embodiments, since the second impurity pattern 220 has a second conductivity type (e.g., a p-type) different from the first conductivity type (e.g., n-type) of the first impurity pattern 210, it may be possible to reduce the power consumption of the erasing operation of the nonvolatile memory device and improve the erasing reliability. For example, at the time of the erasing operation of the nonvolatile memory device according to some embodiments, holes may be smoothly supplied to each channel structure CS through the second impurity pattern 220 including the p-type impurity. As a result, a nonvolatile memory device with improved operation performance and reliability can be provided.

In the nonvolatile memory device according to some embodiments, the separation pattern 230 may prevent the first impurity pattern 210 and the second impurity pattern 220 having different conductivity types from forming a P-N junction. That is, the separation pattern 230 may prevent a junction leakage current generated between the first impurity pattern 210 and the second impurity pattern 220, thereby reducing resistance of the second impurity pattern 220. For example, at the time of the erasing operation of the nonvolatile memory device according to some embodiments, holes may be quickly supplied to each channel structure CS through the second impurity pattern 220 including the p-type impurity. As a result, a nonvolatile memory device with improved operation performance and reliability may be provided.

Figure 4B:
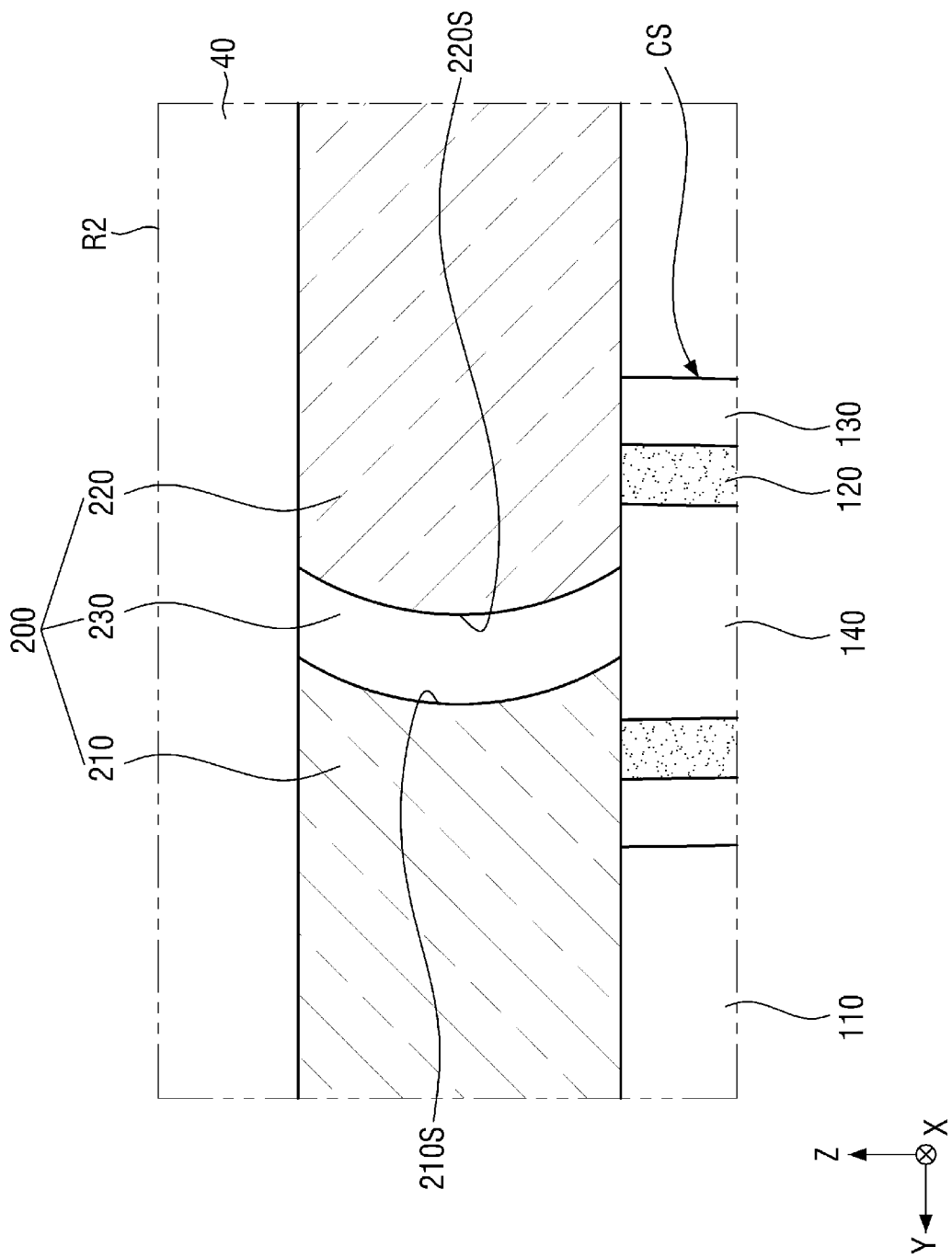

In some embodiments, the side surface of the first impurity pattern 210 may have a curved surface. For example, as illustrated in FIG. 4B, the first impurity pattern 210 may include a first side surface 210S including a curved surface. In some embodiments, the first side surface 210S may be concave.

In some embodiments, the separation pattern 230 and the second impurity pattern 220 may have a shape corresponding to the first side surface 210S. For example, the separation pattern 230 may extend along the profile of the concave first side surface 210S and have a bent shape. Also, for example, the second impurity pattern 220 may include a second side surface 220S that faces the first side surface 210S. The second side surface 220S may extend along the profile of the concave first side surface 210S and have a convex shape.

In some embodiments, the side surface of the first impurity pattern 210 may have a slope. For example, as illustrated in FIG. 4C, the first side surface 210S of the first impurity pattern 210 may have a slope with respect to the upper surface of the channel structure CS. In some embodiments, the first side surface 210S may form an acute angle with respect to the upper surface of the channel structure CS.

In some embodiments, the separation pattern 230 and the second impurity pattern 220 may have a shape corresponding to the first side surface 210S. For example, the separation pattern 230 may extend along the profile of the first side surface 210S having the slope and have a slope. Also, for example, the second side surface 220S may extend along the profile of the first side surface 210S forming an acute angle with respect to the upper surface of the channel structure CS and form an obtuse angle with respect to the upper surface of the channel structure CS.

In some embodiments, the size of the region in which the first impurity pattern 210 overlaps the channel structure CS may be different from the size of the region in which the second impurity pattern 220 overlaps the channel structure CS. For example, as illustrated in FIGS. 4D and 4E, the size of the first region CSa overlapping the first impurity pattern 210 may be different from the size of the second region CSb overlapping the second impurity pattern 220.

For example, as illustrated in FIG. 4D, in the second direction Y, a first overlap length OL1 in which the first impurity pattern 210 overlaps the channel structure CS may be smaller than a second overlap length OL2 in which the second impurity pattern 220 overlaps the channel structure CS.

Or, for example, as illustrated in FIG. 4E, other in the second direction Y, a first overlap length OL1 in which the first impurity pattern 210 overlaps the channel structure CS may be greater than a second overlap length OL2 in which the second impurity pattern 220 overlaps the channel structure CS.

In some embodiments, as illustrated in FIGS. 5 and 6, a first upper contact 48, a third upper wiring 46, a second upper contact 44 and a fourth upper wiring 42 connected to the source structure 200 may be formed.

The first upper contact 48 may be formed to be connected to the first impurity pattern 210. For example, the first upper contact 48 may penetrate the third interlayer insulating layer 40 and be connected to the first impurity pattern 210. The third upper wiring 46 may be formed on the first upper contact 48. For example, the third upper wiring 46 may be formed in the third interlayer insulating layer 40.

In some embodiments, the first upper contact 48 may be formed on the word line cutting region WLc. However, the position of the first upper contact 48 is not limited as long as it is connected to the first impurity pattern 210.

In some embodiments, a first high-concentration impurity region 215 may be formed between the first impurity pattern 210 and the first upper contact 48. For example, the first high-concentration impurity region 215 is formed in the first impurity pattern 210 and may be in contact with the first upper contact 48. The first high-concentration impurity region 215 may have the same first conductivity type (e.g., n-type) as the first impurity pattern 210 and may have a higher impurity concentration than that of the first impurity pattern 210.

In some embodiments, the third upper wiring 46 may be connected to the second upper wiring 325 of FIG. 2. Thus, the first impurity pattern 210 may be connected to the peripheral circuit structure PS of FIG. 2. At the time of the read operation or the write operation of the nonvolatile memory device according to some embodiments, the peripheral circuit structure PS may apply a ground voltage to the first impurity pattern 210 through the first upper contact 48 and the third upper wiring 46.

The second upper contact 44 may be formed to be connected to the second impurity pattern 220. For example, the second upper contact 44 may penetrate the third interlayer insulating layer 40 and be connected to the second impurity pattern 220. The fourth upper wiring 42 may be formed on the second upper contact 44. For example, the fourth upper wiring 42 may be formed in the third interlayer insulating layer 40.

In some embodiments, the second upper contact 44 may be formed on a central part of the second impurity pattern 220. However, the position of the second upper contact 44 is not limited as long as it is connected to the second impurity pattern 220.

In some embodiments, a second high-concentration impurity region 225 may be formed between the second impurity pattern 220 and the second upper contact 44. For example, the second high-concentration impurity region 225 is formed in the second impurity pattern 220 and may be in contact with the second upper contact 44. The second high-concentration impurity region 225 may have the same second conductivity type (e.g., p-type) as the second impurity pattern 220, and may have a higher impurity concentration than that of the second impurity pattern 220.

In some embodiments, the fourth upper wiring 42 may be connected to the second upper wiring 325 of FIG. 2. Thus, the second impurity pattern 220 may be connected to the peripheral circuit structure PS of FIG. 2. At the time of the erasing operation of the nonvolatile memory device according to some embodiments, the peripheral circuit structure PS may apply the erasing voltage to the second impurity pattern 220 through the second upper contact 44 and the fourth upper wiring 42.

The third upper wiring 46 and the fourth upper wiring 42 may include, for example, but are not limited to, metal (e.g., copper (Cu) or aluminum (Al)). The first upper contact 48 and the second upper contact 44 may include, for example, but is not limited to, silicon (e.g., polysilicon) or metal (e.g., tungsten (W) or copper (Cu)).

Referring to FIG. 1 again, in some embodiments, at least a part of the separation pattern 230 may extend in the first direction X and cross the plurality of channel structures CS in a plan view. Also, as described above, each channel structure CS may have a cylindrical shape. In such a case, both the first region CSa of the channel structure CS overlapping the first impurity pattern 210, and the second region CSb of the channel structure CS overlapping the second impurity pattern 220 may have a semicircular shape (or an arcuate shape).

In some embodiments, the second impurity pattern 220 may be formed over a part of the first channel group CG1 and a part of the second channel group CG2. For example, the second impurity pattern 220 extends in the first direction X, and may overlap both the second region CSb of the first channel group CG1 and the second region CSb of the second channel group CG2. In such a case, the erasing operation for the first channel group CG1 and the erasing operation for the second channel group CG2 may be performed simultaneously.

In some embodiments, the separation pattern 230 may surround the second impurity pattern 220 from a planar viewpoint. For example, the separation pattern 230 may extend along the side surface of the second impurity pattern 220. Accordingly, the second impurity pattern 220 may be isolated by the separation pattern 230 from a planar viewpoint. In some embodiments, the second impurity pattern 220 may form a plurality of isolated regions.

In some embodiments, the first impurity pattern 210 may surround the separation pattern 230 from the planar viewpoint. For example, the first impurity pattern 210 may extend along the side surface of the separation pattern 230. In some embodiments, the first impurity pattern 210 may be formed to fill remaining regions of the cell array region CAR except the second impurity pattern 220 and the separation pattern 230.

In some embodiments, a single separation pattern 230 forming the isolated region may cross both the first channel group CG1 and the second channel group CG2, in a plan view. For example, as illustrated in FIG. 1, one separation pattern 230 may form a rectangular isolated region between the word line cutting regions WLc. One separation pattern 230 that forms a rectangular isolated region may cross both the channel structures CS constituting the first channel group CG1 and the channel structures CS2 constituting the second channel group CG2.

Figure 7:
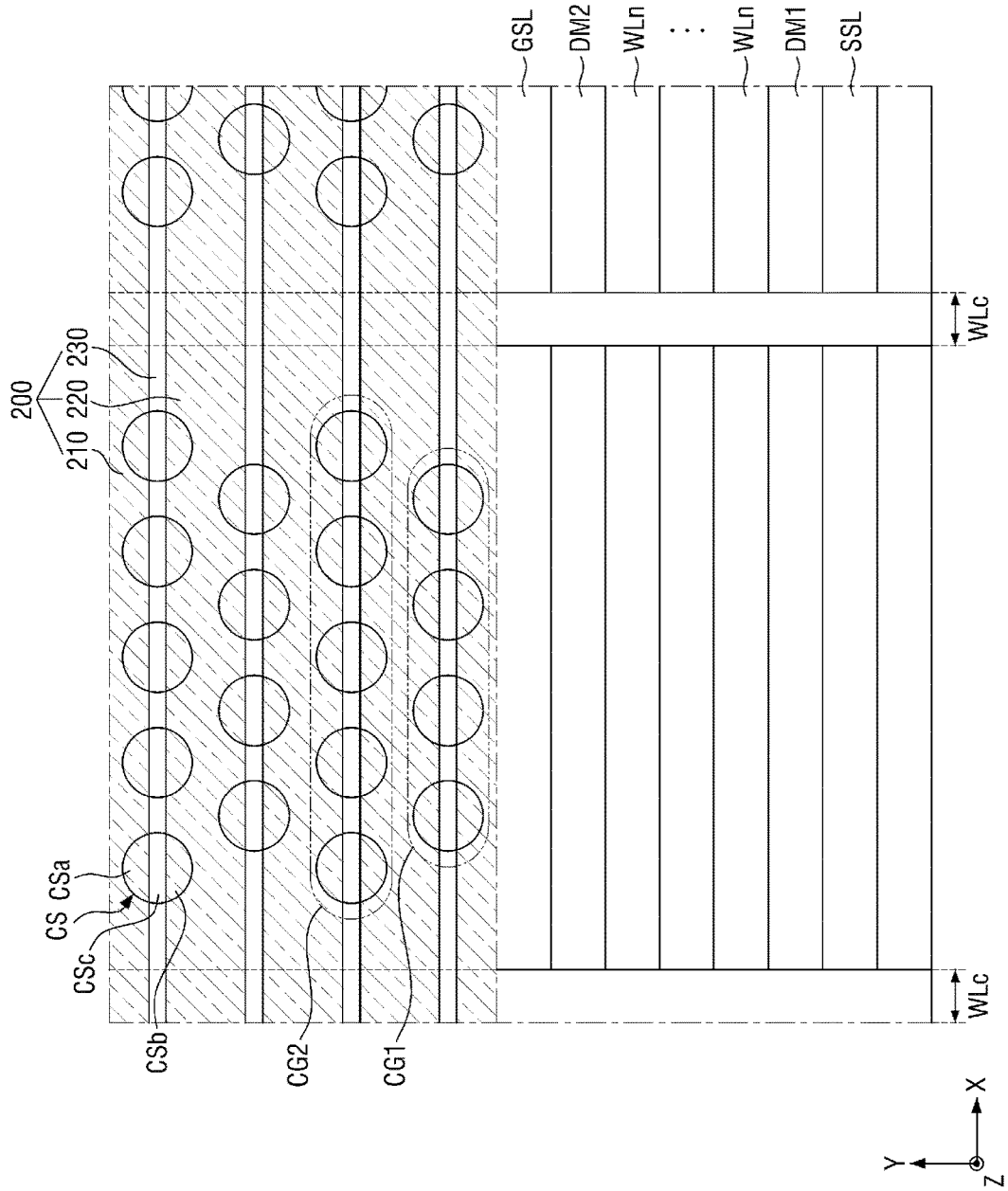
FIG. 7 is a layout diagram for explaining a nonvolatile memory device according to some embodiments.

FIG. 7 is a layout diagram for explaining a nonvolatile memory device according to some embodiments. For convenience of explanation, repeated parts of contents explained above using FIGS. 1 to 6 will be briefly described or omitted.

Referring to FIG. 7, in the nonvolatile memory device according to some embodiments, the separation pattern 230 may extend in the first direction X and cross a plurality of channel structures CS, in a plan view.

For example, a plurality of separation patterns 230 spaced apart from each other and extending side by side in the first direction X may be formed. At this time, one separation pattern 230 may cross the channel structures CS constituting the first channel group CG1, and another separation pattern 230 may cross the channel structures CS constituting the second channel group CG2.

In some embodiments, the plurality of separation patterns 230 extending long in the first direction X may intersect the word line cutting region WLc.

Figure 8:
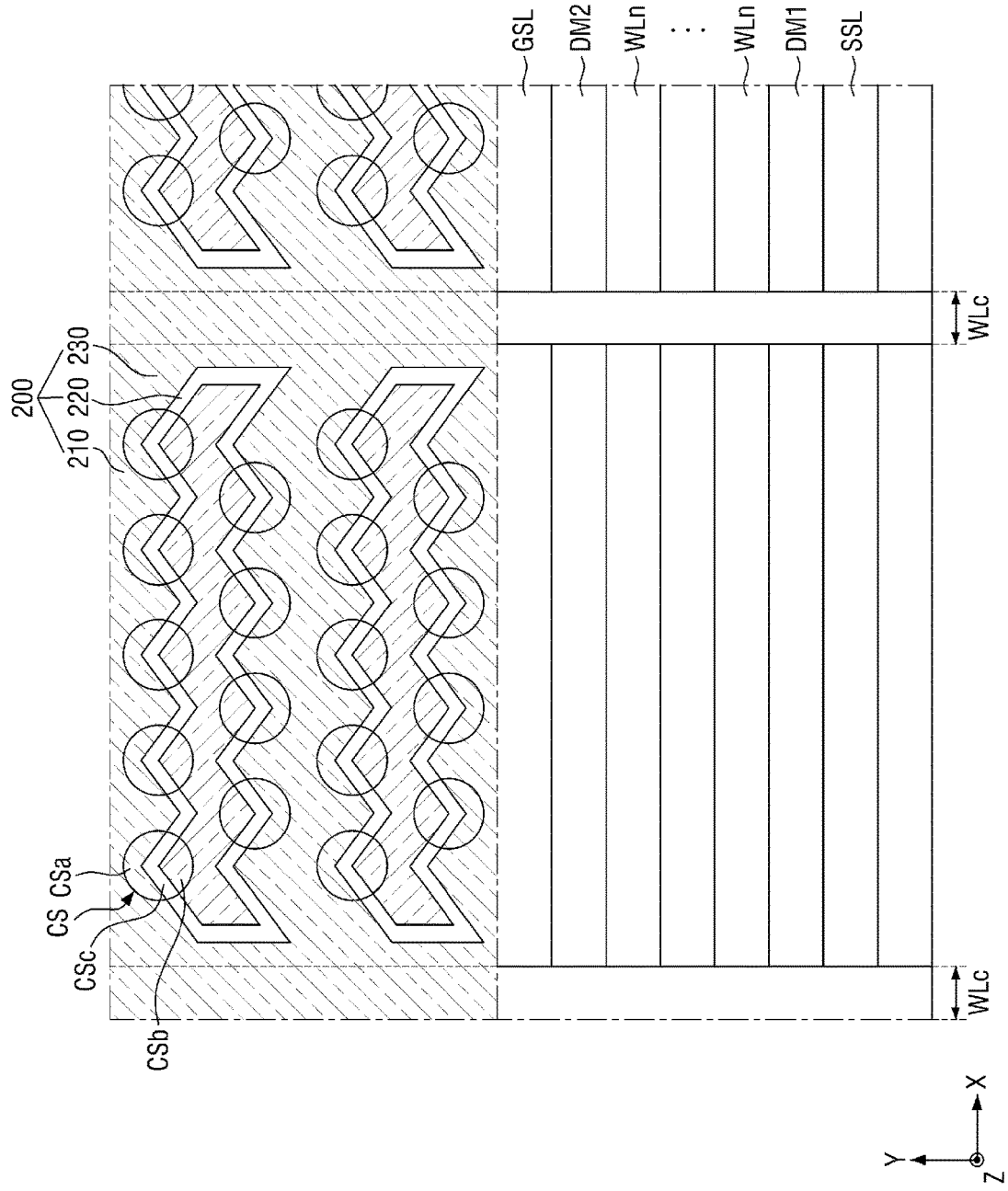
FIG. 8 is a layout diagram for explaining a nonvolatile memory device according to some embodiments.

FIG. 8 is a layout diagram for explaining a nonvolatile memory device according to some embodiments. For convenience of explanation, repeated parts of contents explained above using FIGS. 1 to 6 will be briefly described or omitted.

Referring to FIG. 8, in the nonvolatile memory device according to some embodiments, at least a part of the separation pattern 230 may cross the plurality of channel structures CS in a zigzag form.

For example, the third region CSc of the channel structure CS overlapping the separation pattern 230 may have a V shape. In such a case, the second region CSb of the channel structure CS overlapping the second impurity pattern 220 may have an arcuate shape. Although a central angle of the arcuate shape is illustrated as only being smaller than 180°, this is merely an example. For example, the central angle of the arcuate shape may be larger than 180°.

In some embodiments, the size of the region in which the first impurity pattern 210 overlaps the channel structure CS may be different from the size of the region in which the second impurity pattern 220 overlaps the channel structure CS.

Figure 9:
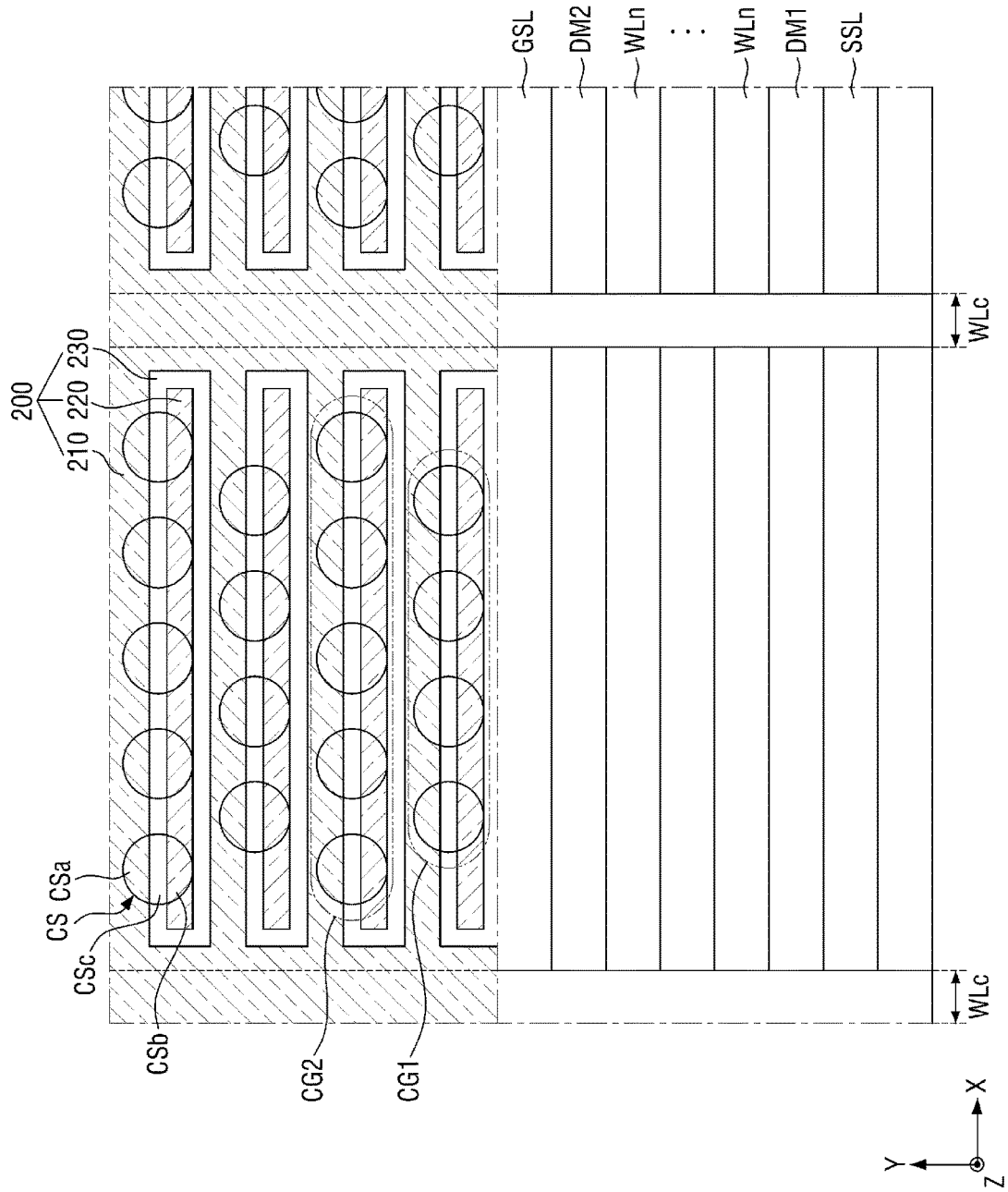
FIG. 9 is a layout diagram for explaining a nonvolatile memory device according to some embodiments.

FIG. 9 is a layout diagram for explaining a nonvolatile memory device according to some embodiments. For convenience of explanation, repeated parts of contents explained above using FIGS. 1 to 6 will be briefly described or omitted.

Referring to FIG. 9, in the nonvolatile memory device according to some embodiments, one second impurity pattern 220 may be formed over only one of the first channel group CG1 and the second channel group CG2.

For example, one second impurity pattern 220 among the plurality of second impurity patterns 220 forming the plurality of isolated regions may overlap a part of the first channel group CG1, and may not overlap the second channel group CG2.

Or, for example, another second impurity pattern 220 among the plurality of second impurity patterns 220 forming the plurality of isolated regions may overlap a part of the second channel group CG2, and may not overlap the first channel group CG1.

In such a case, the erasing operation for the first channel group CG1 and the erasing operation for the second channel group CG2 may be performed separately.

Figure 10:
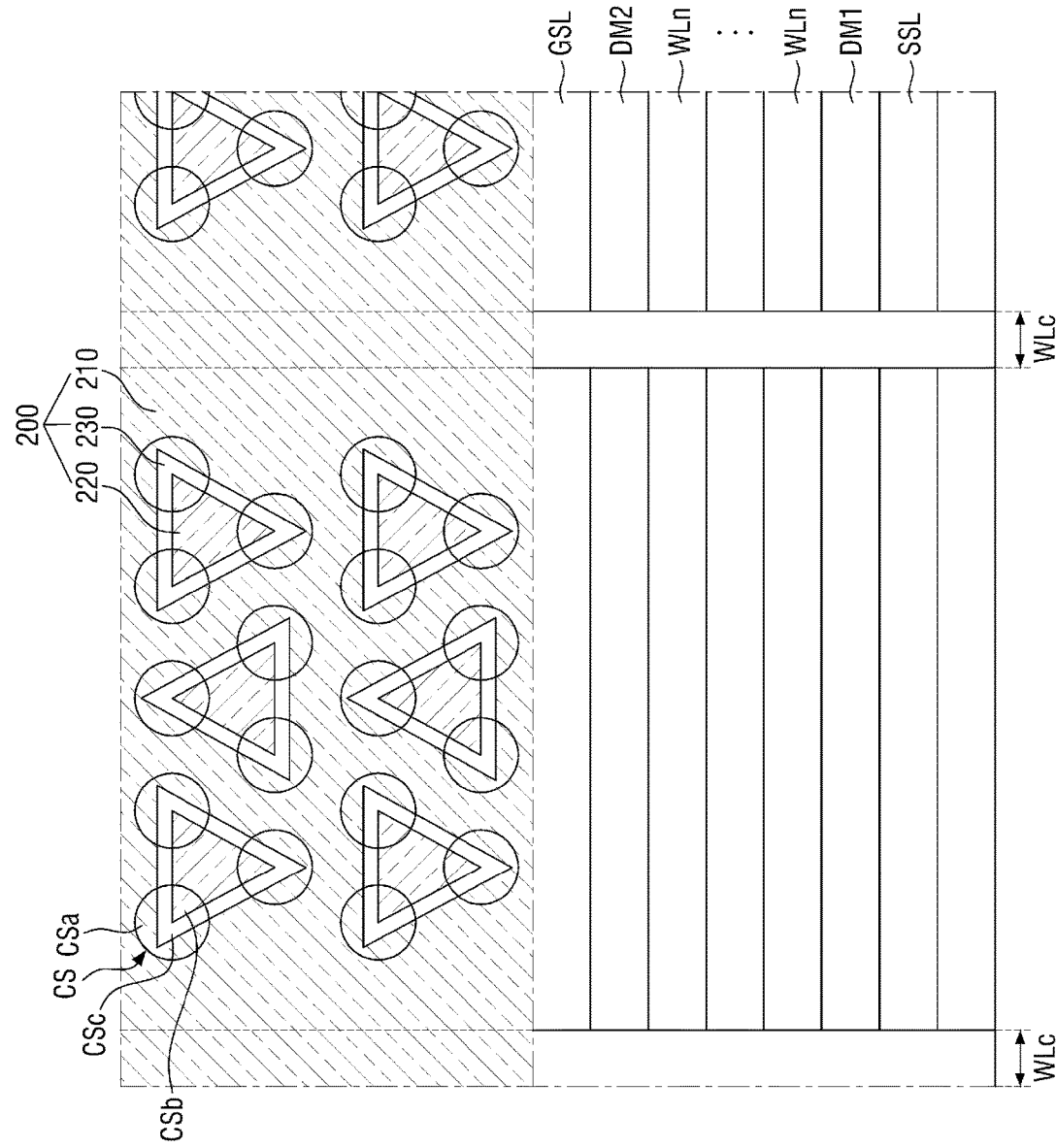
FIG. 10 is a layout diagram for explaining a nonvolatile memory device according to some embodiments.

FIG. 10 is a layout diagram for explaining a nonvolatile memory device according to some embodiments. For convenience of explanation, repeated parts of contents explained above using FIGS. 1 to 6 will be briefly described or omitted.

Referring to FIG. 10, in the nonvolatile memory device according to some embodiments, one second impurity pattern 220 may overlap three channel structures CS adjacent to each other.

For example, the separation pattern 230 may have a triangular shape from the planar viewpoint. In such a case, the third region CSc of the channel structure CS overlapping the separation pattern 230 may have a V shape. Further, the second region CSb of the channel structure CS overlapping the second impurity pattern 220 may have an arcuate shape.

In some embodiments, the erasing operation for the three channel structures CS overlapping one second impurity pattern 220 may be performed simultaneously.

The nonvolatile memory device according to some embodiments will be described below with reference to FIGS. 1 to 16.

FIGS. 11 to 16 are intermediate stage diagrams for explaining an example method for fabricating the nonvolatile memory device according to some embodiments. For convenience of explanation, repeated parts of contents explained above using FIGS. 1 to 10 will be briefly described or omitted.

Figure 11:
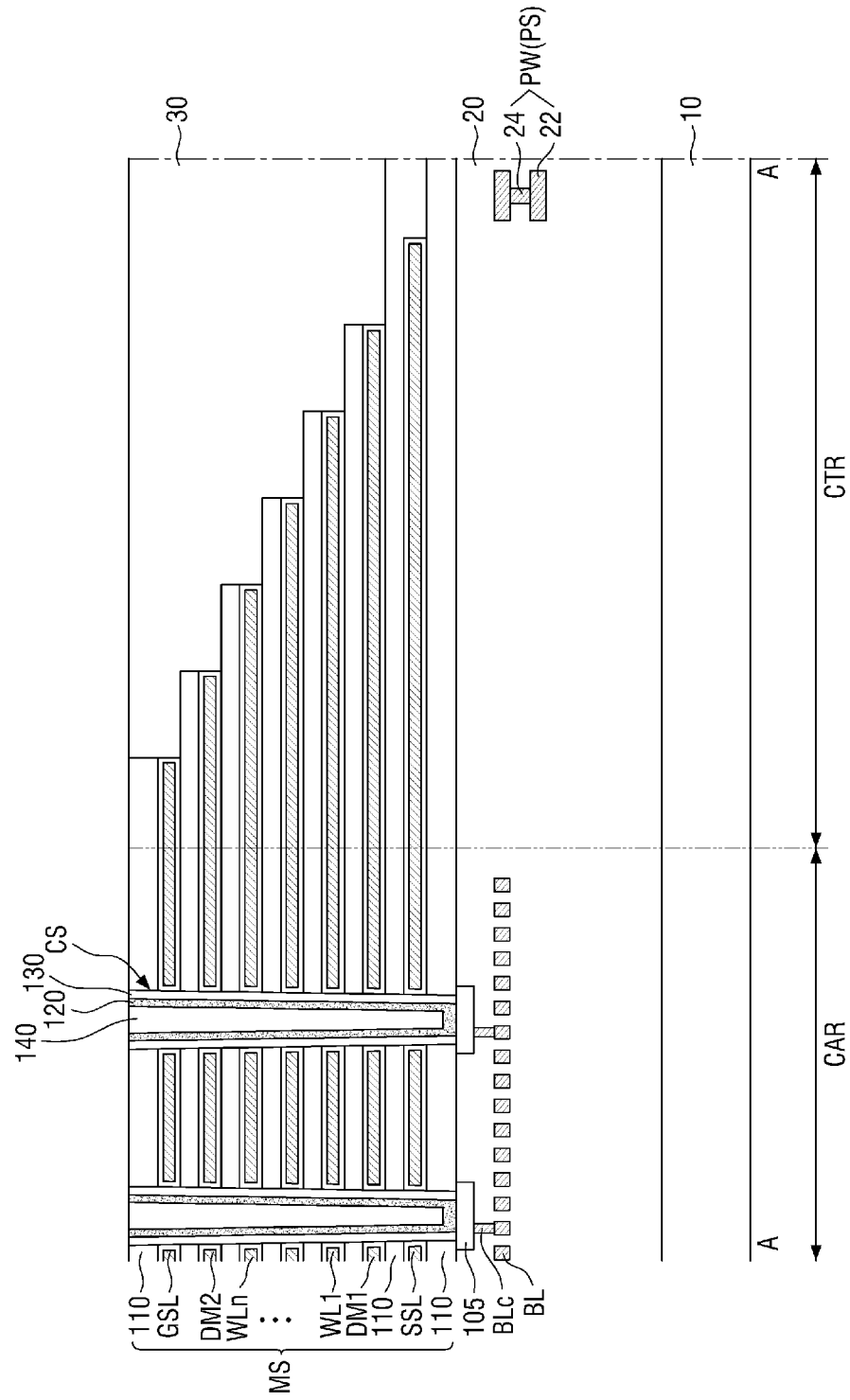
FIGS. 11 to 16 are intermediate stage diagrams for explaining an example method for fabricating the nonvolatile memory device according to some embodiments.

Referring to FIG. 11, a peripheral circuit structure PS, a mold structure MS, and a plurality of channel structures CS are formed on the substrate 10.

The peripheral circuit structure PS may be formed, for example, in the first interlayer insulating layer 20 on the substrate 10. The peripheral circuit structure PS may include a wiring structure PW.

In some embodiments, a bit line BL extending in the first direction X and a bit line contact BLc connected to the bit line BL may be further formed in the first interlayer insulating layer 20. In some embodiments, a stud 105 connected to the bit line contact BLc may be further formed in the first interlayer insulating layer 20.

Subsequently, a mold structure MS may be formed on the peripheral circuit structure PS. For example, the mold structure MS may be formed on the first interlayer insulating layer 20. The mold structure MS may include a plurality of gate electrodes SSL, DM1, WL1 to WLn, DM2 and GSL and a plurality of insulating patterns 110 stacked on the peripheral circuit structure PS. The plurality of insulating patterns 110 may be interlaced (i.e., alternating) with the plurality of gate electrodes SSL, DM1, WL1 to WLn, DM2 and GSL.

Subsequently, a plurality of channel structures CS penetrating the mold structure MS may be formed. In some embodiments, each channel structure CS may include a semiconductor pattern 120 and an information storage layer 130.

In some embodiments, a second interlayer insulating layer 30 may be formed on the first interlayer insulating layer 20. The second interlayer insulating layer 30 may be formed to cover or overlap at least a part of the mold structure MS.

Figure 12:
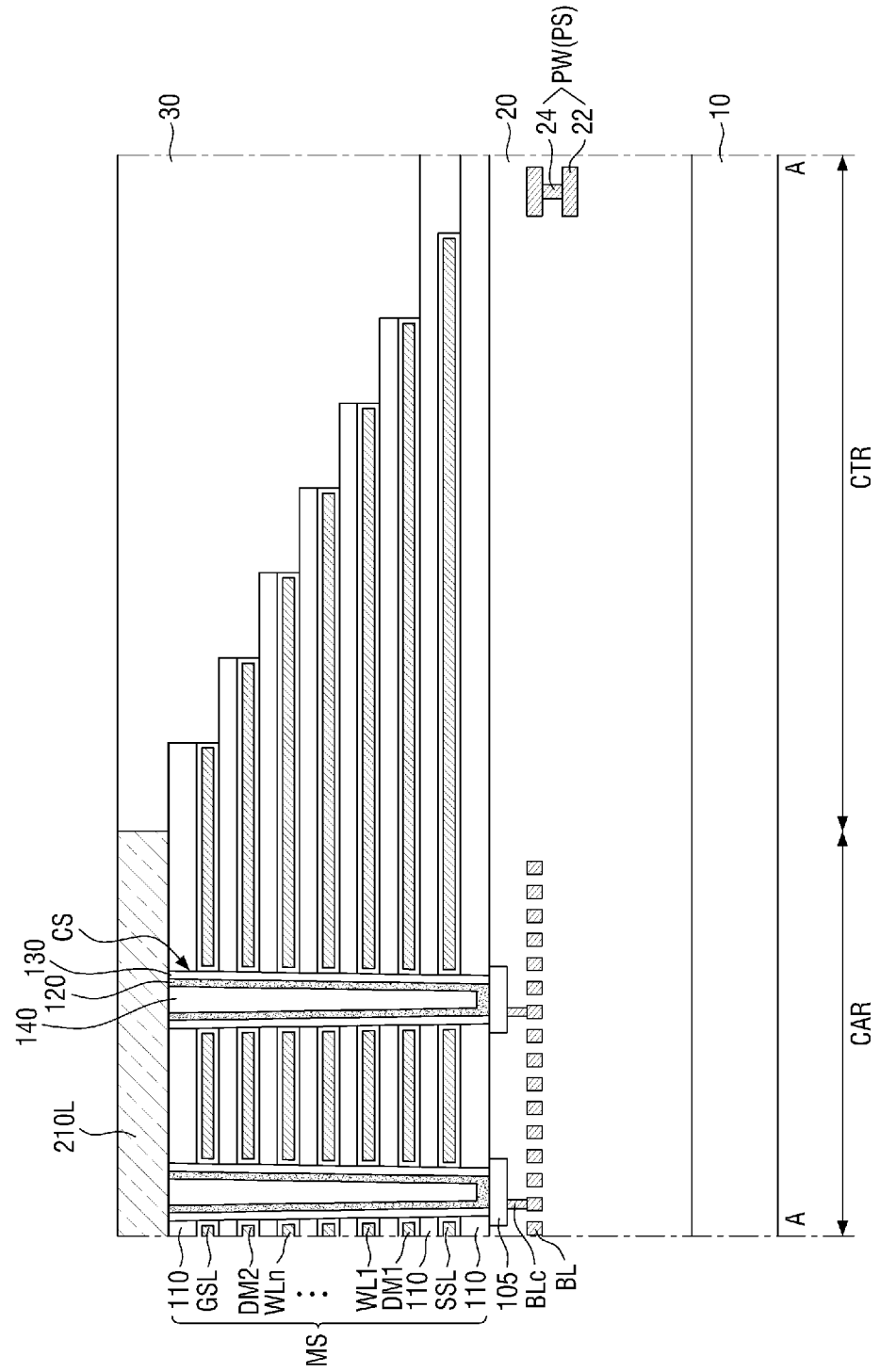

Referring to FIG. 12, a first impurity layer 210L is formed on the mold structure MS.

The first impurity layer 210L is formed on the cell array region CAR and may be connected to the upper parts of each channel structure CS. In some embodiments, the first impurity layer 210L may be in contact with the upper surface of the semiconductor pattern 120.

In some embodiments, the first impurity layer 210L may have a first conductivity type. Hereinafter, for convenience of description, the first impurity layer 210L will be described as including the n-type impurity.

Figure 13:
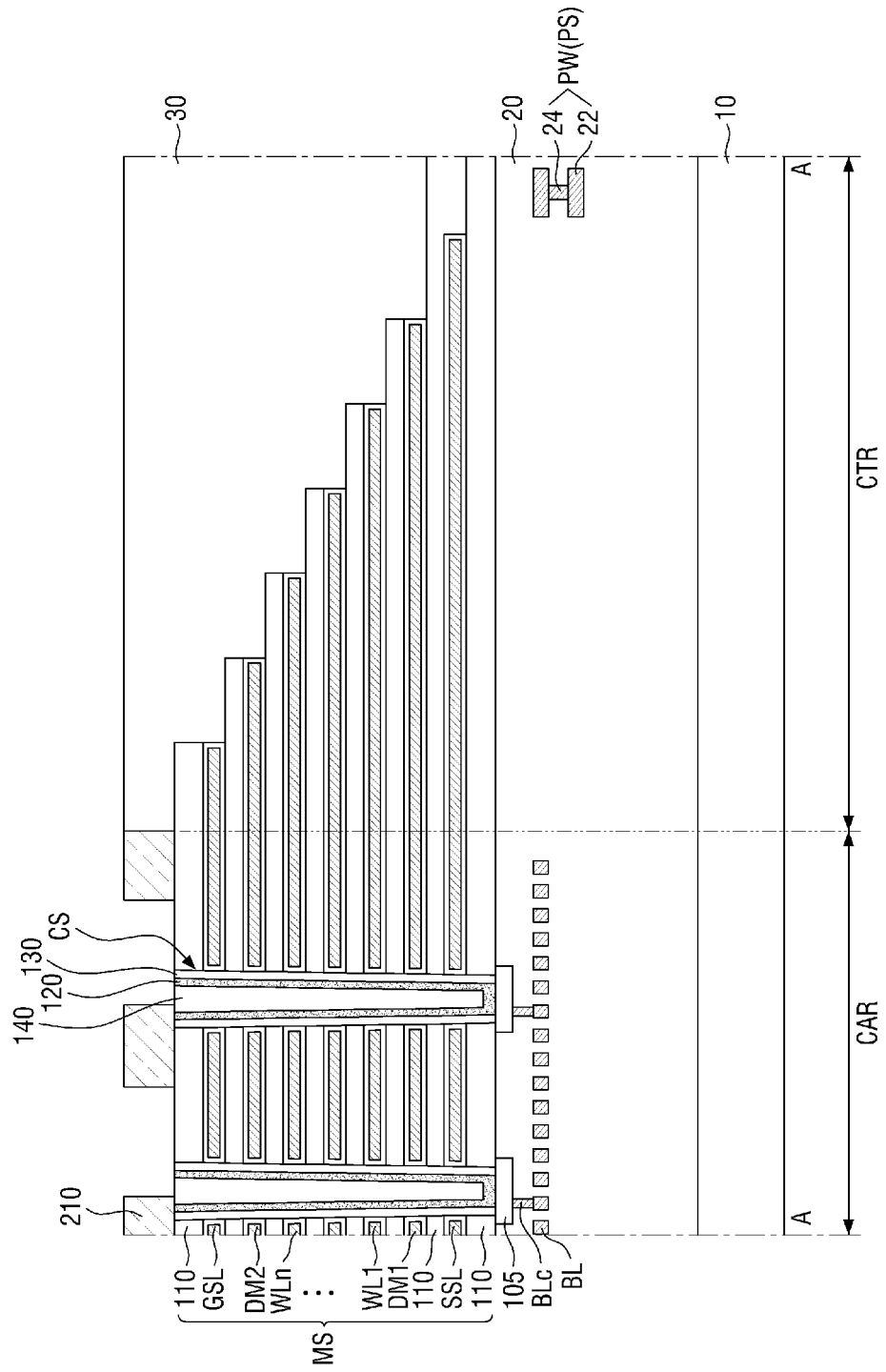

Referring to FIG. 13, the first impurity layer 210L is patterned to form the first impurity pattern 210.

The first impurity pattern 210 may be patterned to expose a part of each channel structure CS. That is, the first impurity pattern 210 may overlap a part of the channel structure CS, and may expose another part of the channel structure CS. In some embodiments, the first impurity pattern 210 may be formed to expose a part of the upper surface of the semiconductor pattern 120.

The formation of the first impurity pattern 210 may be performed by, for example, but is not limited to, a photolithography process.

Figure 14:
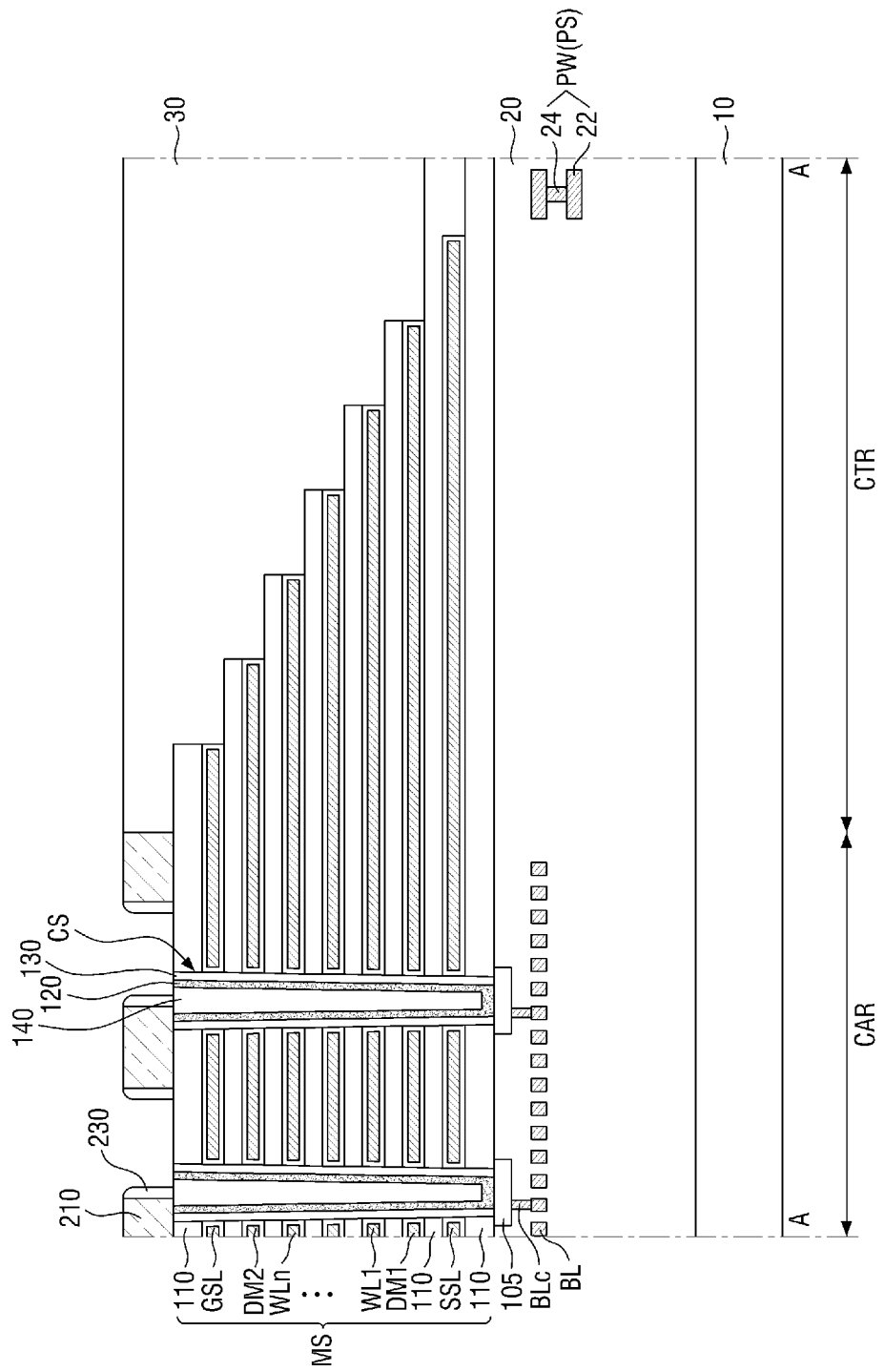

Referring to FIG. 14, a separation pattern 230 is formed on a side surface of the first impurity pattern 210.

For example, a separation layer extending along the profiles of the first impurity pattern 210, the mold structure MS, and the first interlayer insulating layer 20 may be formed. Subsequently, a part of the separation layer formed on the upper surface of the first impurity pattern 210, the upper surface of the mold structure MS, and the first interlayer insulating layer 20 may be removed. The removal of a part of the separation layer may be performed by, for example, but is not limited to, an anisotropic etching process. Accordingly, the separation pattern 230 may be formed on the side surface of the first impurity pattern 210.

In some embodiments, the separation pattern 230 may be formed to expose a part of each channel structure CS. That is, the first impurity pattern 210 and the separation pattern 230 may overlap a part of the channel structure CS, and may expose another part of the channel structure CS. In some embodiments, the separation pattern 230 may be formed to expose a part of the upper surface of the semiconductor pattern 120.

The separation pattern 230 may include an insulating material. The separation pattern 230 may include, for example, but is not limited to, at least one of silicon oxide, silicon nitride, and silicon oxynitride.

Figure 15:
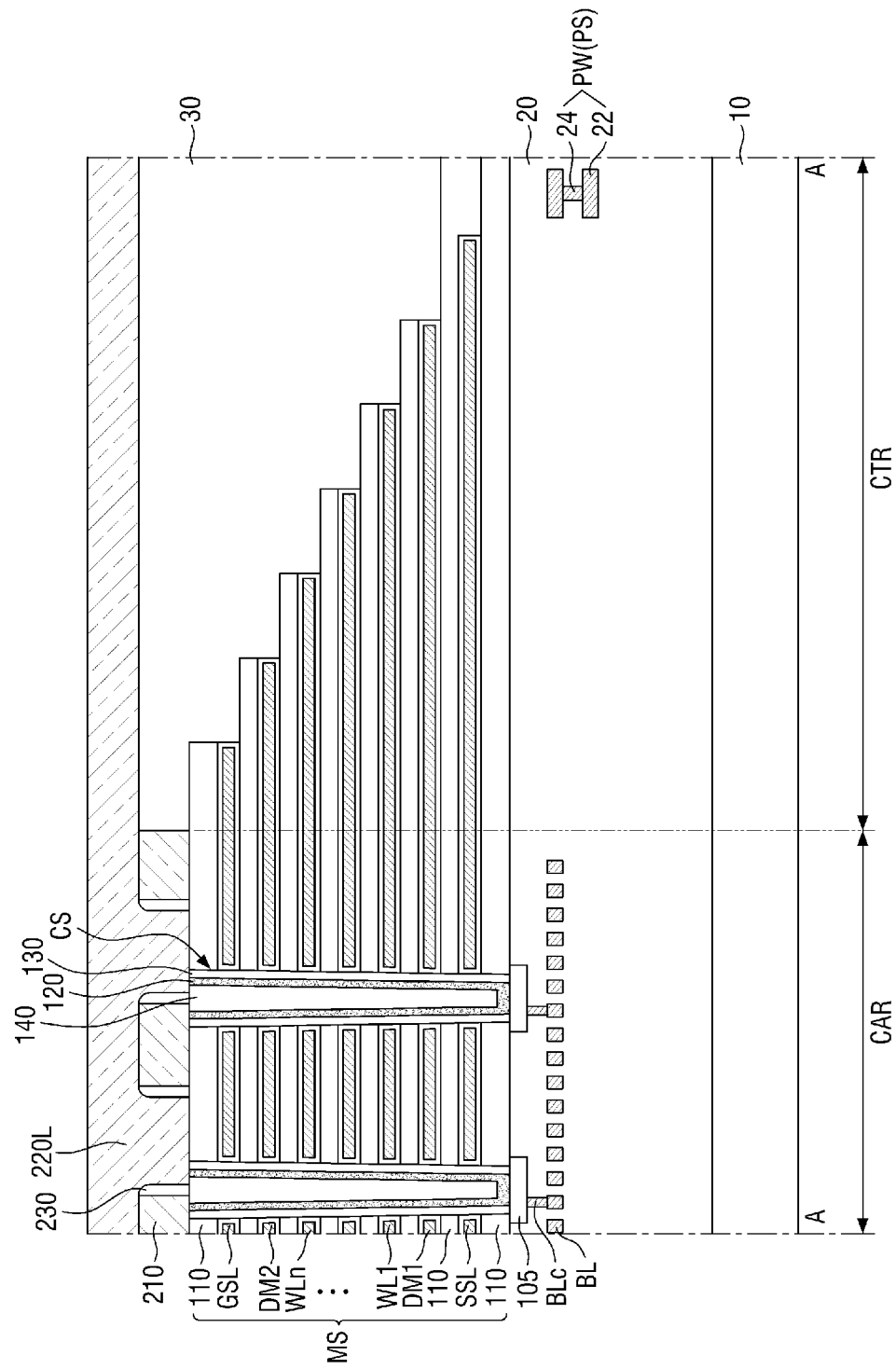

Referring to FIG. 15, a second impurity layer 220L is formed on the first impurity pattern 210 and the separation pattern 230.

For example, the second impurity layer 220L extending along the profiles of the first impurity pattern 210, the separation pattern 230, the mold structure MS, and the first interlayer insulating layer 20 may be formed.

The second impurity layer 220L may be connected to each channel structure CS exposed by the first impurity pattern 210 and the separation pattern 230. In some embodiments, the second impurity layer 220L may be in contact with a part of the upper surface of the semiconductor pattern 120 exposed by the first impurity pattern 210 and the separation pattern 230.

In some embodiments, the second impurity layer 220L may have a second conductivity type different from the first conductivity type. For example, the second impurity layer 220L may include a p-type impurity.

Figure 16:
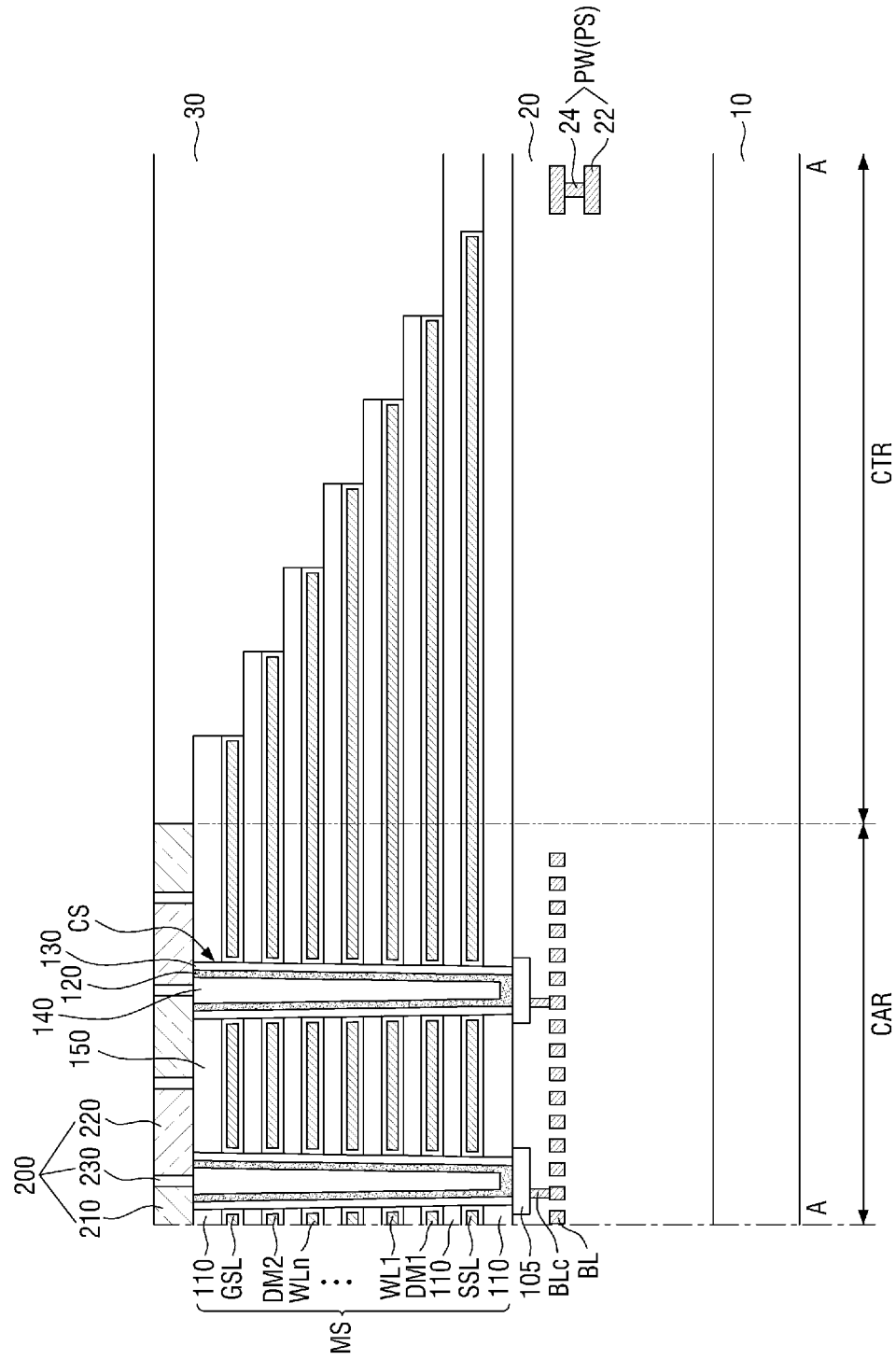

Referring to FIG. 16, a planarization process is performed to form the second impurity pattern 220.

For example, the planarization process may be performed until the upper part of the separation pattern 230 is removed. Accordingly, the second impurity pattern 220 may be separated from the first impurity pattern 210 by the separation pattern 230. Further, the source structure 200 including the first impurity pattern 210, the second impurity pattern 220, and the separation pattern 230 may be formed accordingly.

The planarization process may include, for example, but is not limited to, a chemical mechanical polishing (CMP) process.

Next, referring to FIGS. 1 to 6, a third interlayer insulating layer 40 is formed on the source structure 200 and the second interlayer insulating layer 30. Further, the memory cell contacts 310 and the through via THV are formed in the contact region CTR. In addition, the first upper contact 48 connected to the first impurity pattern 210, and the second upper contact 44 connected to the second impurity pattern 220 are formed.

In some embodiments, as illustrated in FIG. 2, first upper wirings 315 connected to the memory cell contacts 310 and second upper wirings 325 connected to the through via THV may be formed in the third interlayer insulating layer 40.

Also, in some embodiments, as illustrated in FIGS. 5 and 6, a third upper wiring 46 connected to the first upper contact 48, and a fourth upper wiring 42 connected to the second upper contact 44 may be formed in the third interlayer insulating layer 40.

While the present inventive concept has been particularly shown and described with reference to example embodiments thereof, it will be understood by those of ordinary skill in the art that various changes in form and detail may be made therein without departing from the spirit and scope of the present inventive concept as defined by the following claims. Therefore, the example embodiments described above should be considered in a descriptive sense only and not for purposes of limitation.

What is claimed is:

1. A nonvolatile memory device comprising:
a substrate;
a peripheral circuit structure on the substrate;
a mold structure comprising a first surface and a second surface different from each other and comprising a plurality of insulating patterns and a plurality of gate electrodes stacked alternately on the peripheral circuit structure;
a bit line that extends in a first direction on the first surface of the mold structure;
a source structure comprising a first impurity pattern and a second impurity pattern having a different material from the first impurity pattern, wherein the source structure is on the second surface of the mold structure; and
a channel structure that extends in a second direction and penetrates the mold structure and comprises a first region adjacent to the bit line and a second region adjacent to the source structure,
wherein the second region comprises a first channel region electrically connected to the first impurity pattern and a second channel region electrically connected to the second impurity pattern.

2. The nonvolatile memory device of claim 1, further comprising:
a separation pattern which separates the first impurity pattern and the second impurity pattern, wherein the separation pattern is on the mold structure.

3. The nonvolatile memory device of claim 1,
wherein the first impurity pattern overlaps the first channel region of the channel structure, and the second impurity pattern overlaps the second channel region of the channel structure from a planar viewpoint.

4. The nonvolatile memory device of claim 2, wherein the separation pattern extends along a side surface of the second impurity pattern and surrounds the second impurity pattern from a planar viewpoint and comprises an isolated region, and the first impurity pattern surrounds the separation pattern from the planar viewpoint.

5. The nonvolatile memory device of claim 2, wherein the separation pattern intersects the channel structure from a planar viewpoint.

6. The nonvolatile memory device of claim 2, wherein the separation pattern intersects the channel structure in a zigzag pattern from a planar viewpoint.

7. The nonvolatile memory device of claim 2, wherein the separation pattern is in a closed loop shape from a planar viewpoint.

8. The nonvolatile memory device of claim 7, wherein the closed loop shape is in a triangular shape.

9. The nonvolatile memory device of claim 1, wherein the channel structure comprises a semiconductor pattern that penetrates the mold structure, and an information storage layer between the semiconductor pattern and ones of the plurality of gate electrodes.

10. The nonvolatile memory device of claim 9, wherein the first impurity pattern and the second impurity pattern are in contact with one surface of the semiconductor pattern.

11. The nonvolatile memory device of claim 9, wherein the information storage layer comprises a tunnel insulating layer, a charge storage layer, and a blocking insulating layer stacked on the semiconductor pattern.

12. A nonvolatile memory device comprising:
a substrate;
a peripheral circuit structure on the substrate;
a bit line that extends in a first direction on the peripheral circuit structure;
a mold structure comprising a plurality of insulating patterns and a plurality of gate electrodes alternately stacked on the bit line;
a source structure comprising a first impurity pattern and a second impurity pattern having different conductivity types, wherein the source structure is on the mold structure; and
a plurality of channel structures that penetrate the mold structure and are between the bit line and the source structure,
wherein each of the channel structures comprise a first region that is electrically connected to the bit line through a bit line contact and a second region directly connected to the source structure, and
wherein the second region comprises a first channel region that overlaps the first impurity pattern and a second channel region that overlaps the second impurity pattern.

13. The nonvolatile memory device of claim 12, further comprising:
a separation pattern which separates the first impurity pattern and the second impurity pattern, wherein the separation pattern is on the mold structure,
wherein the separation pattern extends along a side surface of the second impurity pattern and surrounds the second impurity pattern from a planar viewpoint and comprises at least one isolated region, and the first impurity pattern surrounds the separation pattern from the planar viewpoint.

14. The nonvolatile memory device of claim 12, wherein the second channel region which overlaps the second impurity pattern has a semicircular shape or an arcuate shape.

15. The nonvolatile memory device of claim 13, wherein first portions of the plurality of channel structures are along a second direction intersecting the first direction and comprises a first channel group,
wherein second portions of the plurality of channel structures are along the second direction and comprise a second channel group, and
wherein the second channel group is adjacent to the first channel group in the first direction.

16. The nonvolatile memory device of claim 15, wherein the second channel region of the first channel group and the second channel region of the second channel group are in a same one of the at least one isolated region.

17. The nonvolatile memory device of claim 15, wherein the second channel region of the first channel group and the second channel region of the second channel group are in different ones of the at least one isolated region.

18. The nonvolatile memory device of claim 12, wherein the first impurity pattern comprises an n-type impurity, and
wherein the second impurity pattern comprises a p-type impurity.

* * * * *